(12) United States Patent
Toyotaka et al.

(10) Patent No.: US 10,083,991 B2
(45) Date of Patent: Sep. 25, 2018

(54) DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventors: Kouhei Toyotaka, Atsugi (JP); Kei Takahashi, Isehara (JP); Hideaki Shishido, Atsugi (JP); Koji Kusunoki, Kawasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/375,453

(22) Filed: Dec. 12, 2016

(65) Prior Publication Data

US 2017/0186777 A1 Jun. 29, 2017

(30) Foreign Application Priority Data

Dec. 28, 2015 (JP) .................................. 2015-256583
Nov. 9, 2016 (JP) .................................. 2016-218998

(51) Int. Cl.
*H01L 27/12* (2006.01)
*H01L 29/04* (2006.01)
(Continued)

(52) U.S. Cl.
CPC ........ *H01L 27/1225* (2013.01); *H01L 27/124* (2013.01); *H01L 29/045* (2013.01);
(Continued)

(58) Field of Classification Search
CPC . H01L 51/50–51/56; H01L 51/0032–51/0095;
(Continued)

(56) References Cited

U.S. PATENT DOCUMENTS 7,601,984 B2  10/2009  Sano et al.
7,679,585 B2   3/2010  Kimura
(Continued)

FOREIGN PATENT DOCUMENTS

JP  2006-165529 A   6/2006
JP  2009-278115 A  11/2009
(Continued)

OTHER PUBLICATIONS

International Search Report (Application No. PCT/IB2016/057759) dated Feb. 28, 2017.
(Continued)

*Primary Examiner* — Tucker J Wright
(74) *Attorney, Agent, or Firm* — Robinson Intellectual Property Law Office; Eric J. Robinson

(57) ABSTRACT

A novel display device or the like in which a transistor connected to a scan line has small gate capacitance is provided. A novel display device or the like in which a scan line has low resistance is provided. A novel display device or the like in which pixels can be arranged with high density is provided. A novel display device or the like that can be manufactured without an increase in cost is provided. In a transistor including a first gate electrode and a second gate electrode, the first gate electrode is formed using a metal material with low resistance and the second gate electrode is formed using a metal oxide material that can reduce oxygen vacancies in an oxide semiconductor layer. The first gate electrode is connected to the scan line, and the second gate electrode is connected to a wiring to which a constant potential is supplied.

25 Claims, 27 Drawing Sheets

(51) Int. Cl.
　　　*H01L 29/49*　　　(2006.01)
　　　*H01L 29/786*　　(2006.01)
　　　*H01L 27/32*　　　(2006.01)

(52) U.S. Cl.
　　　CPC ...... *H01L 29/4908* (2013.01); *H01L 29/7869* (2013.01); *H01L 29/78648* (2013.01); *H01L 27/3262* (2013.01)

(58) Field of Classification Search
　　　CPC ............................ H01L 27/32–27/3297; H01L 27/3244–27/3279; H01L 27/1214–27/1296; H01L 29/7869–29/78693
　　　See application file for complete search history.

(56) References Cited

U.S. PATENT DOCUMENTS

| | | | |
|---|---|---|---|
| 8,242,986 B2 | 8/2012 | Kimura | |
| 8,384,076 B2 | 2/2013 | Park et al. | |
| 8,937,580 B2 | 1/2015 | Miyagawa | |
| 8,957,889 B2 | 2/2015 | Miyake | |
| 9,230,996 B2 | 1/2016 | Miyake et al. | |
| 9,263,589 B2 | 2/2016 | Endo et al. | |
| 9,508,861 B2 | 11/2016 | Yamazaki et al. | |
| 2011/0003418 A1* | 1/2011 | Sakata | H01L 21/02554 438/34 |
| 2012/0206956 A1* | 8/2012 | Fujita | G11C 7/20 365/72 |
| 2014/0361292 A1 | 12/2014 | Yamazaki et al. | |
| 2015/0333088 A1 | 11/2015 | Yamazaki et al. | |

FOREIGN PATENT DOCUMENTS

| | | |
|---|---|---|
| JP | 2011-029635 A | 2/2011 |
| JP | 2012-009836 A | 1/2012 |
| JP | 2013-201435 A | 10/2013 |
| JP | 2014-241404 A | 12/2014 |
| JP | 2015-165582 A | 9/2015 |
| JP | 2015-195327 A | 11/2015 |
| JP | 2015-233135 A | 12/2015 |
| KR | 2015-0131978 A | 11/2015 |

OTHER PUBLICATIONS

Written Opinion (Application No. PCT/IB2018/057759) dated Feb. 28, 2017.

* cited by examiner

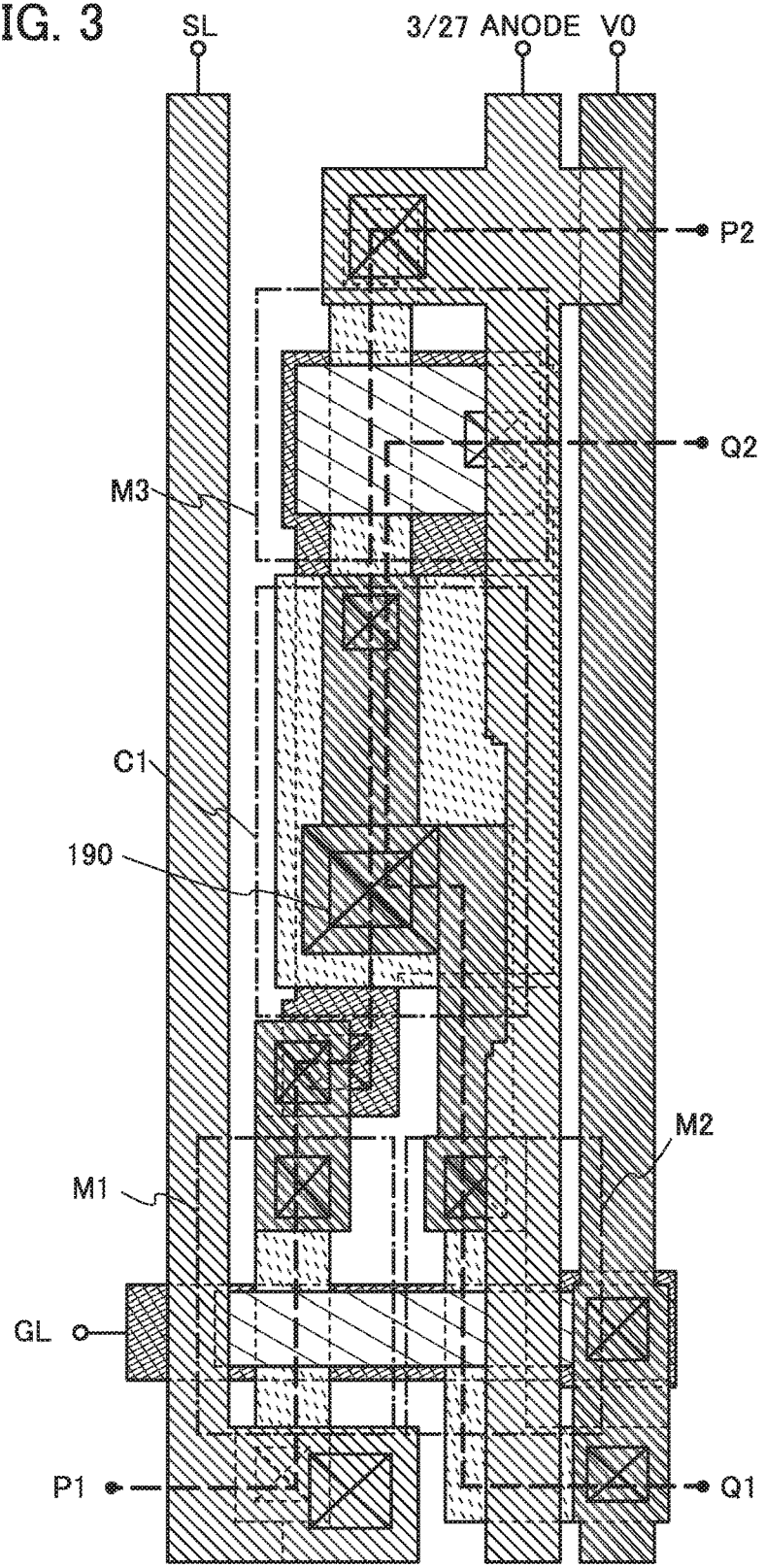

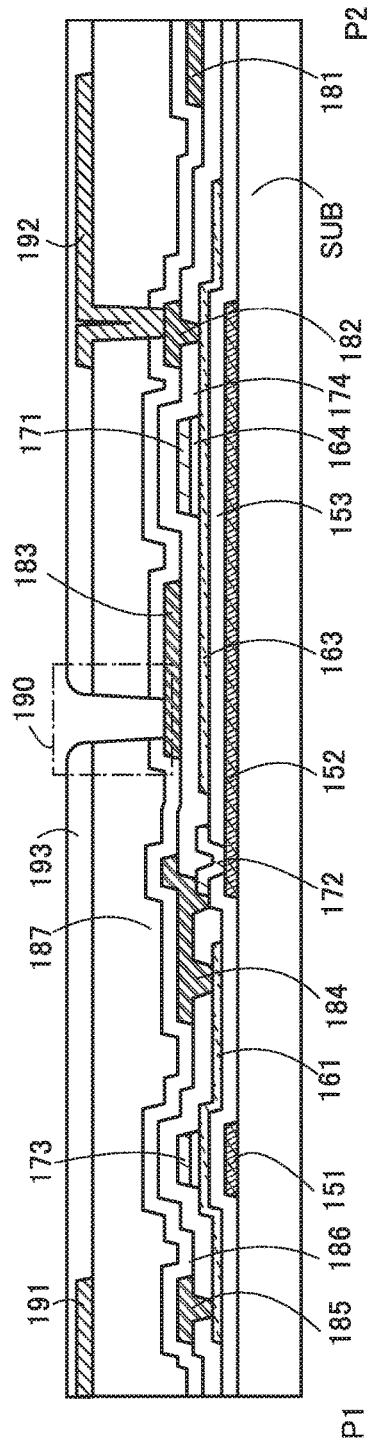
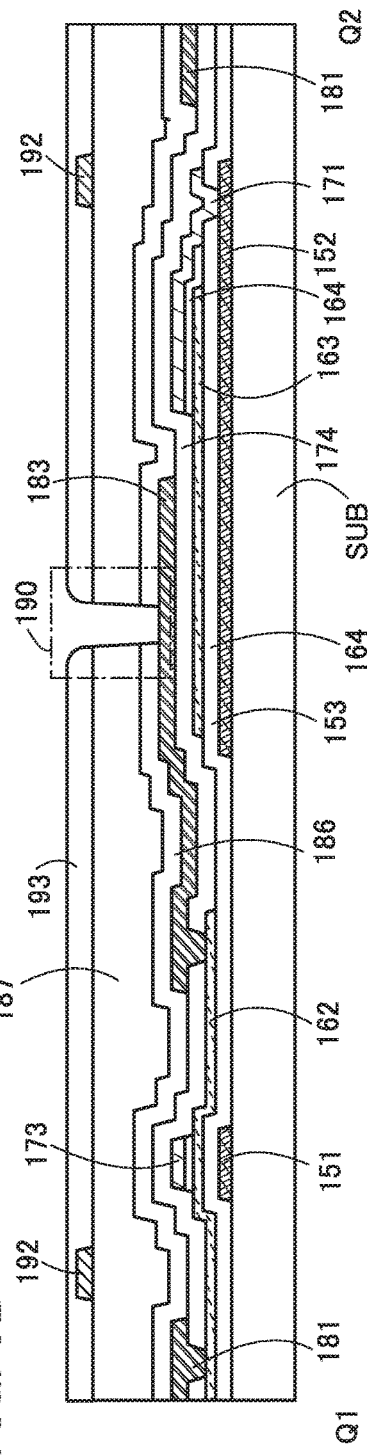

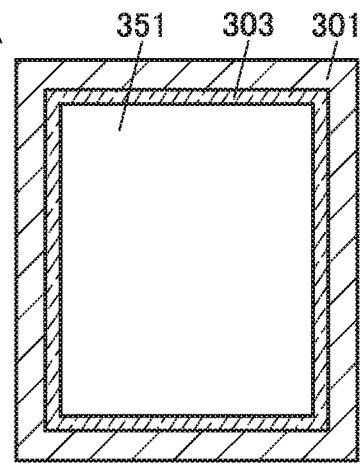
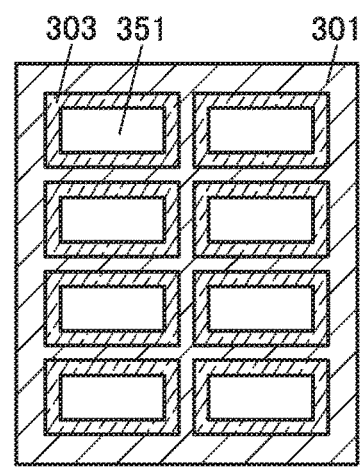
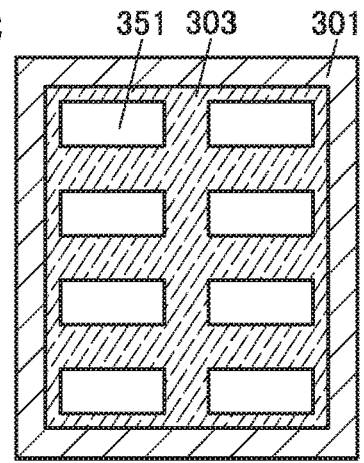

ated to above technical field. The technical field of one embodiment of the invention disclosed in this specification and the like relates to an object, a method, or a manufacturing method. One embodiment of the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

BACKGROUND ART

A technique for forming a transistor using a semiconductor layer formed over a substrate having an insulating surface (also referred to as a field-effect transistor (FET) or a thin film transistor (TFT)) has been attracting attention. The transistor is used in a wide range of electronic devices such as an integrated circuit (IC) and an image display device (display device). Semiconductor materials typified by silicon are widely known as materials for semiconductor layers that can be used for transistors. As other materials, oxide semiconductors have been attracting attention.

For example, a technique for forming a transistor using an amorphous oxide containing In, Zn, Ga, Sn, and the like as an oxide semiconductor is disclosed (see Patent Document 1). A technique for forming a self-aligned top-gate transistor using an oxide layer is also disclosed (see Patent Document 2). In addition, a technique for forming a transistor in which an oxide layer where a channel is formed is electrically surrounded by electric fields of top and bottom gate electrodes to achieve high field-effect mobility is disclosed (see Patent Document 3).

In addition, a technique for forming a transistor with high electrical reliability, e.g., a small shift in threshold voltage by using an insulating layer that releases oxygen by being heated as a base insulating layer of an oxide semiconductor layer where a channel is formed, to reduce oxygen vacancies in the oxide semiconductor layer is disclosed (see Patent Document 4).

REFERENCE

Patent Document

[Patent Document 1] Japanese Published Patent Application No. 2006-165529
[Patent Document 2] Japanese Published Patent Application No. 2009-278115
[Patent Document 3] Japanese Published Patent Application No. 2014-241404
[Patent Document 4] Japanese Published Patent Application No. 2012-009836

DISCLOSURE OF INVENTION

Transistors including oxide layers are expected to be used for display devices. Such transistors are required to have high field-effect mobility and high reliability. To achieve high field-effect mobility, it is effective in a transistor to electrically surround an oxide layer where a channel is formed. However, there is a problem in that the gate capacitance of such a transistor in which an oxide layer where a channel is formed is electrically surrounded by electric fields of gate electrodes is excessively increased when the transistor is driven with a signal of a scan line.

To decrease gate capacitance, a single-gate structure, rather than a structure in which an oxide layer is surrounded by gate electrodes, is effectively used. However, the use of a gate electrode that is formed with, for example, an oxide layer and releases oxygen by being heated as a top gate to achieve high reliability causes a problem of increasing the resistance of the gate electrode, or the resistance of a scan line, compared with the use of a gate electrode formed with metal.

Such a structure in which a gate electrode that releases oxygen by being heated is used as a top gate effectively allows a transistor to have high reliability. Therefore, to reduce the resistance of a scan line in this structure, it is effective to use a gate electrode formed with metal as a bottom gate and to form the scan line using a metal wiring on the bottom gate side. However, such a structure has a problem in that forming an opening for connecting a top gate and a bottom gate in a small region such as a pixel region makes the layout difficult, resulting in difficulty in fabricating a high-definition display device. Although a metal wiring can be stacked over a gate electrode that releases oxygen by being heated so that the resistance of a scan line is reduced, this structure has a problem in that the number of steps increases and thus the manufacturing cost increases.

In view of the above problems, an object of one embodiment of the present invention is to provide a novel display device or the like in which a transistor connected to a scan line has small gate capacitance. Another object of one embodiment of the present invention is to provide a novel display device or the like in which a scan line has low resistance. Another object of one embodiment of the present invention is to provide a novel display device or the like in which pixels can be arranged with high density. Another object of one embodiment of the present invention is to provide a novel display device or the like that can be manufactured without an increase in cost.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the aforementioned objects and the other objects.

One embodiment of the present invention is a display device including a first transistor, a second transistor, a first wiring, and a second wiring. The first transistor includes a first gate electrode, a second gate electrode, and a first semiconductor layer. The second transistor includes a first gate electrode, a second gate electrode, and a second semiconductor layer. The first wiring is configured to transmit a signal for controlling conduction states of the first transistor and the second transistor. The second wiring is configured to transmit a constant voltage. The first gate electrode of the first transistor and the first gate electrode of the second transistor are electrically connected to the first wiring. The second gate electrode of the first transistor and the second gate electrode of the second transistor are electrically connected to the second wiring. The first semiconductor layer and the second semiconductor layer include an oxide semiconductor. The first gate electrode of the first transistor and the first gate electrode of the second transistor include a metal material. The second gate electrode of the first transistor and the second gate electrode of the second transistor include a metal oxide material.

One embodiment of the present invention is a display device including a first transistor, a second transistor, a third transistor, a first wiring, and a second wiring. The first transistor includes a first gate electrode, a second gate electrode, and a first semiconductor layer. The second transistor includes a first gate electrode, a second gate electrode, and a second semiconductor layer. The third transistor includes a first gate electrode, a second gate electrode, and a third semiconductor layer. The first wiring is configured to transmit a signal for controlling conduction states of the first transistor and the second transistor. The second wiring is configured to transmit a constant voltage. The first gate electrode of the first transistor and the first gate electrode of the second transistor are electrically connected to the first wiring. The second gate electrode of the first transistor and the second gate electrode of the second transistor are electrically connected to the second wiring. The first gate electrode of the third transistor and the second gate electrode of the third transistor are electrically connected to each other. The first semiconductor layer, the second semiconductor layer, and the third semiconductor layer include an oxide semiconductor. The first gate electrode of the first transistor, the first gate electrode of the second transistor, and the first gate electrode of the third transistor include a metal material. The second gate electrode of the first transistor, the second gate electrode of the second transistor, and the second gate electrode of the third transistor include a metal oxide material.

One embodiment of the present invention is a display device including a first transistor, a second transistor, a third transistor, a capacitor, a light-emitting element, a first wiring, and a second wiring. The first transistor includes a first gate electrode, a second gate electrode, and a first semiconductor layer. The second transistor includes a first gate electrode, a second gate electrode, and a second semiconductor layer. The third transistor includes a first gate electrode, a second gate electrode, and a third semiconductor layer. The first wiring is configured to transmit a signal for controlling conduction states of the first transistor and the second transistor. The second wiring is configured to transmit a constant voltage. The first gate electrode of the first transistor and the first gate electrode of the second transistor are electrically connected to the first wiring. The second gate electrode of the first transistor and the second gate electrode of the second transistor are electrically connected to the second wiring. One of a source and a drain of the first transistor is electrically connected to the first gate electrode of the third transistor, one electrode of the capacitor, and the second gate electrode of the third transistor. One of a source and a drain of the second transistor is electrically connected to one of a source and a drain of the third transistor, the other electrode of the capacitor, and one electrode of the light-emitting element. The first semiconductor layer, the second semiconductor layer, and the third semiconductor layer include an oxide semiconductor. The first gate electrode of the first transistor, the first gate electrode of the second transistor, and the first gate electrode of the third transistor include a metal material. The second gate electrode of the first transistor, the second gate electrode of the second transistor, and the second gate electrode of the third transistor include a metal oxide material.

One embodiment of the present invention is a display device including a pixel electrically connected to a first wiring and a second wiring. The pixel includes a first transistor and a second transistor. The first transistor includes a first gate electrode, a second gate electrode, and a first semiconductor layer. The second transistor includes a first gate electrode, a second gate electrode, and a second semiconductor layer. The first wiring is configured to transmit a signal for controlling conduction states of the first transistor and the second transistor. The second wiring is configured to transmit a constant voltage. The first gate electrode of the first transistor and the first gate electrode of the second transistor are electrically connected to the first wiring. The second gate electrode of the first transistor and the second gate electrode of the second transistor are electrically connected to the second wiring. The first semiconductor layer and the second semiconductor layer include an oxide semiconductor. The first gate electrode of the first transistor and the first gate electrode of the second transistor include a metal material. The second gate electrode of the first transistor and the second gate electrode of the second transistor include a metal oxide material.

In the display device of one embodiment of the present invention, the oxide semiconductor preferably includes oxygen, In, Zn, and M (M is Al, Ga, Y, or Sn).

In the display device of one embodiment of the present invention, the oxide semiconductor preferably includes a crystal part having c-axis alignment.

In the display device of one embodiment of the present invention, the metal oxide material preferably includes oxygen, In, Zn, and M (M is Al, Ga, Y, or Sn), and the metal oxide material preferably has a higher carrier density than the oxide semiconductor.

Note that other embodiments of the present invention will be described in the following embodiments with reference to the drawings.

One embodiment of the present invention can provide a novel display device or the like in which a transistor connected to a scan line has small gate capacitance. Another embodiment of the present invention can provide a novel display device or the like in which a scan line has low resistance. Another embodiment of the present invention can provide a novel display device or the like in which pixels can be arranged with high density. Another embodiment of the present invention can provide a novel display device or the like that can be manufactured without an increase in cost.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the aforementioned effects and the other effects. Accordingly, one embodiment of the present invention does not have the aforementioned effects in some cases.

BRIEF DESCRIPTION OF DRAWINGS

FIG. 3 is a top view of a display device of one embodiment.

FIGS. 5A and 5B are cross-sectional views of a display device of one embodiment.

FIGS. 17A to 17C illustrate the method for manufacturing a display device of one embodiment.

BEST MODE FOR CARRYING OUT THE INVENTION

Figure 1A:
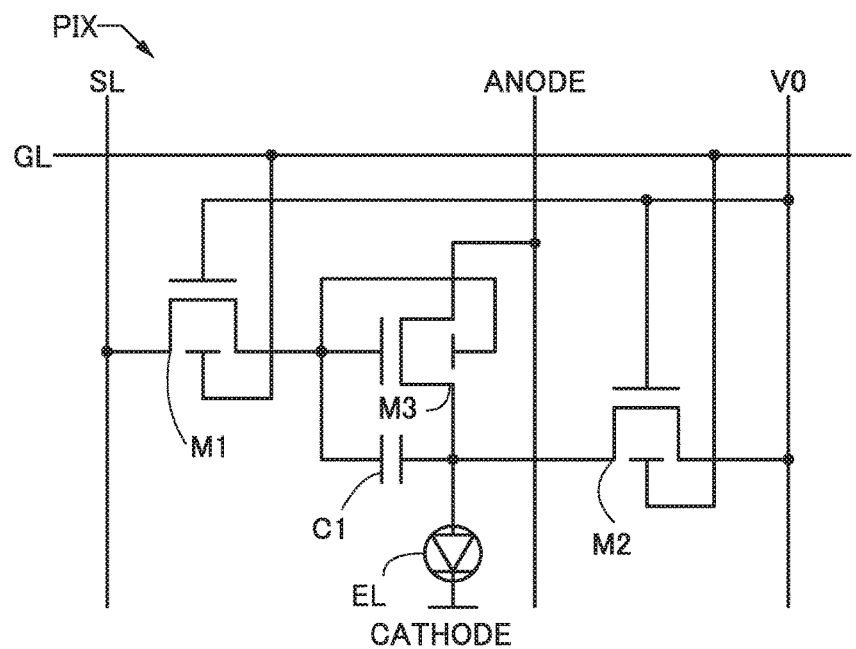
FIGS. 1A and 1B are a circuit diagram and a timing chart of a display device of one embodiment.

Embodiments and an example will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example.

Note that in structures of the present invention described below, the same portions or portions having similar functions are denoted by the same reference numerals in different drawings, and the description thereof is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not necessarily limited to the illustrated scale.

Note that in this specification and the like, ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. A transistor in this specification includes, in its category, an insulated-gate field effect transistor (IGFET) and a thin film transistor (TFT).

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

(Embodiment 1)

In this embodiment, a configuration example of a display device of one embodiment of the present invention will be described.

[Configuration Example of Circuit Diagram]

FIG. 1A is a circuit diagram of a pixel included in a display device.

A pixel PIX includes a transistor M1, a transistor M2, a transistor M3, a capacitor C1, and a light-emitting element EL. The pixel PIX is connected to a scan line GL, a signal line SL, a current supply line ANODE, a wiring V0, and a common wiring CATHODE. The pixel PIX corresponds to a subpixel included in a pixel that performs color display. Although description will be given assuming that the transistors M1 to M3 are n-channel transistors, the transistors M1 to M3 may be p-channel transistors.

The scan line GL is a wiring for supplying a scan signal to a pixel. A scan signal is a signal for controlling the conduction state of a transistor that is supplied with the scan signal. The signal line SL is a wiring for supplying a signal corresponding to image data to the pixel. The current supply line ANODE and the common wiring CATHODE are wirings for supplying current to the light-emitting element EL. The wiring V0 is a wiring to which a constant voltage is applied.

In the transistors M1 and M2, gate electrodes are provided over and below a semiconductor layer. The gate electrode located below the semiconductor layer and formed using a metal material is referred to as a first gate electrode (also referred to as a bottom gate electrode). The gate electrode located over the semiconductor layer and formed using a metal oxide material is referred to as a second gate electrode (also referred to as a top gate electrode). Structure examples that can be used for the transistors M1 and M2 will be described later. Although the transistor M3 has the same structure as those of the transistors M1 and M2 in FIG. 1A, the structure of the transistor M3 is not limited thereto. Note that the metal oxide material includes a metal element and oxygen.

The first gate electrode of the transistor M1 is connected to the scan line GL. The second gate electrode of the transistor M1 is connected to the wiring V0. One of a source and a drain of the transistor M1 is connected to the signal line SL. The other of the source and the drain of the transistor M1 is connected to a first gate electrode and a second gate electrode of the transistor M3 and one electrode of the capacitor C1.

The first gate electrode of transistor M2 is connected to the scan line GL. The second gate electrode of the transistor M2 is connected to the wiring V0. One of a source and a drain of the transistor M2 is connected to the wiring V0. The other of the source and the drain of the transistor M2 is connected to one of a source and a drain of the transistor M3, the other electrode of the capacitor C1, and one electrode of the light-emitting element EL.

The first gate electrode of the transistor M3 is connected to the other of the source and the drain of the transistor M1, the second gate electrode of the transistor M3, and the one electrode of the capacitor C1. The one of the source and the drain of the transistor M3 is connected to the other of the source and the drain of the transistor M2, the other electrode of the capacitor C1, and the one electrode of the light-emitting element EL. The other of the source and the drain of the transistor M3 is connected to the current supply line ANODE.

The one electrode of the capacitor C1 is connected to the other of the source and the drain of the transistor M1 and the first gate electrode and the second gate electrode of the transistor M3. The other electrode of the capacitor C1 is connected to the other of the source and the drain of the transistor M2, the one of the source and the drain of the transistor M3, and the one electrode of the light-emitting element EL.

The one electrode of the light-emitting element EL is connected to the other of the source and the drain of the transistor M2, the one of the source and the drain of the transistor M3, and the other electrode of the capacitor C1. The other electrode of the light-emitting element EL is connected to the common wiring CATHODE.

The scan line GL, to which the first gate electrode of the transistor M1 and the first gate electrode of the transistor M2 are connected, is formed with the metal material below the semiconductor layer. The scan line GL is connected to the first gate electrode of the transistor M1 and the first gate electrode of the transistor M2 without passing through an opening. The wiring V0, to which the second gate electrode of the transistor M1 and the second gate electrode of the transistor M2 are connected, is formed with a metal material included in a conductive layer above the transistors M1 and M2. The wiring V0 is connected to the second gate electrode of the transistor M1 and the second gate electrode of the transistor M2 through an opening.

Figure 1B:
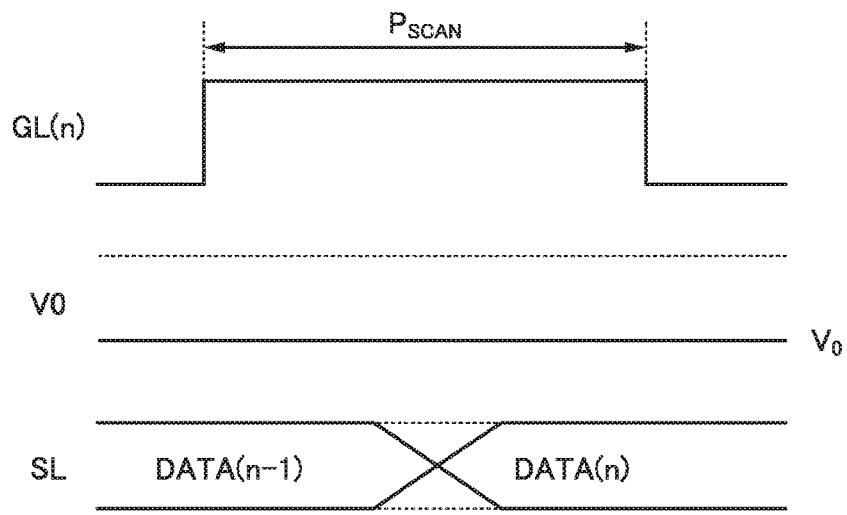

FIG. 1B is a timing chart briefly showing the operation of the circuit in FIG. 1A. FIG. 1B shows the voltage of the wiring V0 and an image signal of the signal line SL in one scan line selection period (PscAN) of a scan line GL(n) in an n-th row.

As shown in FIG. 1B, the image signal of the signal line in SL in PscAN is switched from a signal DATA(n−1) of a (n−1)-th row to a signal DATA(n) of the n-th row. During this period, the voltage of the wiring V0 is a constant voltage $V_0$.

In the above configuration, the first gate electrode and the second gate electrode are not connected to each other in the transistors M1 and M2. Owing to the configuration, the gate capacitance between the scan line GL and the transistors is formed only between the scan line GL and the first gate electrodes in contrast to the case where the first and second gate electrodes are connected to each other. The gate capacitance between the wiring V0 and the transistors M1 and M2 is negligible because the constant voltage is applied to the wiring V0. Thus, the above configuration can reduce the gate capacitance between the scan line GL and the transistors compared with the case where the first and second gate electrodes are connected to each other. Furthermore, by controlling the constant voltage $V_0$ that is applied to the wiring V0, the threshold voltages of the transistors M1 and M2 can be adjusted.

Furthermore, in the above configuration, the scan line GL that is formed with the metal material can be provided in the same layer as the first gate electrode in the transistors M1 and M2. Thus, even when the first gate electrode is formed with a conductive layer including the metal material and the second gate electrode is formed with a conductive layer including the metal oxide material such as an oxide semiconductor, a problem of an increase in the resistance of the scan line GL can be avoided. Moreover, manufacturing cost can be reduced by the cost for providing an extra wiring using a metal material to reduce the resistance of the scan line GL.

Since in the above configuration, the first gate electrode can be formed with the conductive layer including the metal material and the second gate electrode can be formed with the conductive layer including the metal oxide material such as an oxide semiconductor, a gate electrode that releases oxygen by being heated is used as the second gate electrode, so that the reliability of the transistors can be improved. In addition, since the first gate electrode and the second gate electrode are not connected to each other in the transistors M1 and M2, which means that the gate electrodes are not connected to each other in a small region such as a pixel region, a high-definition display device can be fabricated.

[Structure Example of Transistor]

Here, a structure example of a transistor that can be used for the transistors M1 and M2 will be described with reference to FIGS. 2A to 2C.

Figure 2A:
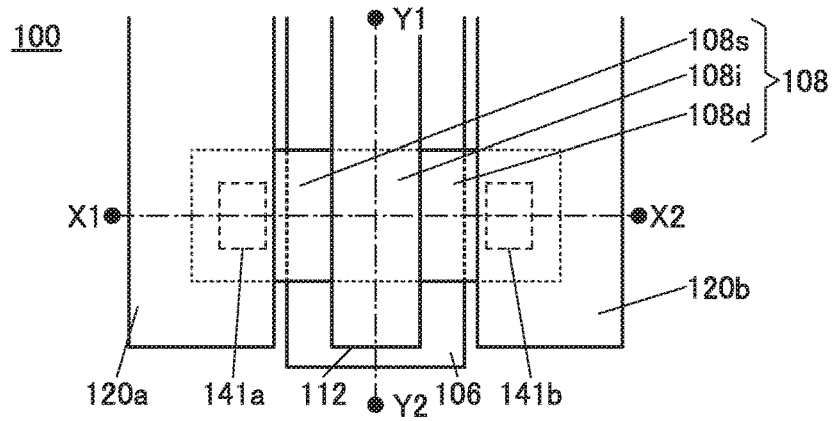
FIGS. 2A to 2C are a top view and cross-sectional views of a display device of one embodiment.
Figure 2B:
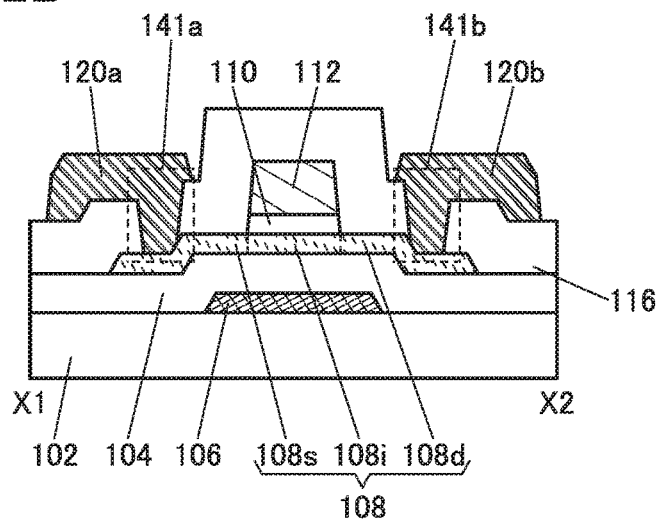
Figure 2C:
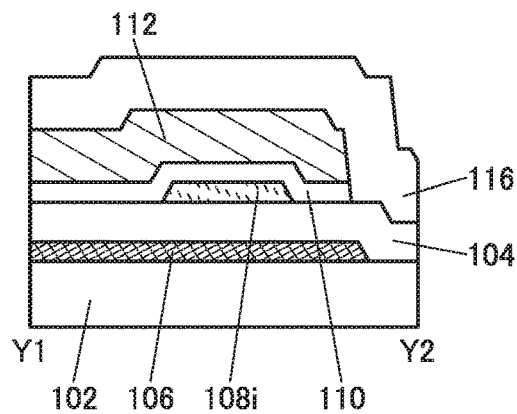

FIGS. 2A to 2C illustrate an example of a semiconductor device including a transistor. Note that the transistor illustrated in FIGS. 2A to 2C has a structure in which gate electrodes are provided over and below a semiconductor layer.

FIG. 2A is a top view of a transistor 100. FIG. 2B is a cross-sectional view taken along the dashed-dotted line X1-X2 in FIG. 2A. FIG. 2C is a cross-sectional view taken along the dashed-dotted line Y1-Y2 in FIG. 2A. For clarity, some components such as an insulating layer 110 are not illustrated in FIG. 2A. As in FIG. 2A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 100 illustrated in FIGS. 2A to 2C includes a conductive layer 106 formed over a substrate 102, an insulating layer 104 formed over the conductive layer 106, an oxide semiconductor layer 108 over the insulating layer 104, the insulating layer 110 over the oxide semiconductor layer 108, an oxide semiconductor layer 112 over the insulating layer 110, and an insulating layer 116 over the insulating layer 104 and the oxide semiconductor layers 108 and 112. Furthermore, the oxide semiconductor layer 108 has a channel region 108i in contact with the insulating layer 110, a source region 108s in contact with the insulating layer 116, and a drain region 108d in contact with the insulating layer 116.

The transistor 100 may further include a conductive layer 120a electrically connected to the source region 108s through an opening 141a formed in the insulating layer 116, and a conductive layer 120b electrically connected to the drain region 108d through an opening 141b formed in the insulating layer 116.

The conductive layer 106 functions as a first gate electrode and is formed using a metal material. The oxide semiconductor layer 112 functions as a second gate electrode and is formed using a metal oxide material. The insulating layer 104 functions as a first gate insulating layer, and the insulating layer 110 functions as a second gate insulating layer.

The insulating layer 116 includes one or both of nitrogen and hydrogen. From the insulating layer 116 including nitrogen and/or hydrogen, nitrogen and/or hydrogen can be supplied to the oxide semiconductor layer 108 and the oxide semiconductor layer 112.

As the insulating layer 116, for example, a nitride insulating layer can be used. The nitride insulating layer can be formed using silicon nitride, silicon nitride oxide, aluminum nitride, aluminum nitride oxide, or the like. The hydrogen concentration in the insulating layer 116 is preferably higher than or equal to $1 \times 10^{22}$ atoms/cm$^3$.

The oxide semiconductor layer 112 has a function of supplying oxygen to the insulating layer 110. The oxide semiconductor layer 112 having a function of supplying oxygen to the insulating layer 110 enables the insulating layer 110 to contain excess oxygen. When the insulating layer 110 includes an excess oxygen region, excess oxygen can be supplied to the oxide semiconductor layer 108, specifically, the channel region 108i. Therefore, a semiconductor device with high reliability can be provided.

The insulating layer 110 can be formed to have a single-layer structure or layered structure using an oxide insulating layer or a nitride insulating layer. For example, the insulating layer 110 can be formed to have a single-layer structure or layered structure using silicon oxide, silicon oxynitride, silicon nitride oxide, silicon nitride, aluminum oxide, hafnium oxide, gallium oxide, a Ga—Zn oxide, or the like.

Since the insulating layer 110 formed over the oxide semiconductor layer 108 contains excess oxygen, excess oxygen can be selectively supplied to the channel region 108i. Alternatively, after excess oxygen is supplied to the channel region 108i, the source region 108s, and the drain region 108d, the carrier density in the source region 108s and the drain region 108d may be selectively increased.

Note that the thickness of the insulating layer 110 is preferably smaller than that of the insulating layer 104. As described above, the constant voltage is applied from the wiring V0 to the oxide semiconductor layer 112 functioning as a second gate electrode. The small thickness of the insulating layer 110 allows large parasitic capacitance to be formed in the transistor 100 by the second gate electrode, the second gate insulating layer, and the oxide semiconductor layer 108. This can suppress the dielectric breakdown of the transistor due to static discharge or the like.

The carrier density in the oxide semiconductor layer 112 having supplied oxygen to the insulating layer 110 is increased by nitrogen and/or hydrogen supplied from the insulating layer 116. In other words, the oxide semiconductor layer 112 also functions as an oxide conductor (OC). Thus, the oxide semiconductor layer 112 has a higher carrier density than the oxide semiconductor layer 108.

Furthermore, the oxide semiconductor layer 112 and the source region 108s and the drain region 108d of the oxide semiconductor layer 108 may each include an element that forms an oxygen vacancy. Typical examples of the element that forms an oxygen vacancy are hydrogen, boron, carbon, nitrogen, fluorine, phosphorus, sulfur, chlorine, and a rare gas element. Typical examples of the rare gas element are helium, neon, argon, krypton, and xenon.

An impurity element added to the oxide semiconductor layer cuts a bond between a metal element and oxygen in the oxide semiconductor layer, so that an oxygen vacancy is formed. Alternatively, when an impurity element is added to the oxide semiconductor layer, oxygen bonded to a metal element in the oxide semiconductor layer is bonded to the impurity element and released from the metal element, so that an oxygen vacancy is formed. As a result, the oxide semiconductor layer has a higher carrier density, and thus, the conductivity thereof becomes higher.

The transistor 100 preferably includes a region in which a side end portion of the insulating layer 110 is aligned with a side end portion of the oxide semiconductor layer 112. In other words, in the transistor 100, an upper end portion of the insulating layer 110 is substantially aligned with a lower end portion of the oxide semiconductor layer 112. The above structure can be obtained by processing the insulating layer 110 with the use of the oxide semiconductor layer 112 as a mask, for example.

The oxide semiconductor layer 108 and the oxide semiconductor layer 112 are each formed using a metal oxide such as In-M-Zn oxide (M is Al, Ga, Y, or Sn). Alternatively, In—Ga oxide or In—Zn oxide may each be used for the oxide semiconductor layer 108 and the oxide semiconductor layer 112. It is particularly preferred that the oxide semiconductor layer 108 and the oxide semiconductor layer 112 be formed using metal oxides containing the same elements because the manufacturing cost can be reduced.

In the case where the oxide semiconductor layers 108 and 112 are each an In-M-Zn oxide, it is preferred that the atomic ratio of metal elements of a sputtering target used to form a layer of the In-M-Zn oxide satisfy In≥M and Zn≥M. As the atomic ratio of metal elements in such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable. Note that the atomic ratios of metal elements in the formed oxide semiconductor layers 108 and 112 may vary from the above atomic ratio of metal elements of the sputtering target within a range of approximately ±40%. For example, when a sputtering target with the atomic ratio of In:Ga:Zn=4:2:4.1 is used, an atomic ratio of In:Ga:Zn in the oxide semiconductor layer may be 4:2:3 and its vicinity.

When an oxide semiconductor layer with a low impurity concentration and a low density of defect states is used in the channel region 108i, the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". It is also possible to call this state "intrinsic" or "substantially intrinsic". A highly purified intrinsic or substantially highly purified intrinsic oxide semiconductor has few carrier generation sources, and thus has a low carrier density in some cases. Thus, a transistor including the oxide semiconductor layer in which a channel region is formed is likely to have a positive threshold voltage (normally-off characteristics). A highly purified intrinsic or substantially highly purified intrinsic oxide semiconductor layer has a low density of defect states and accordingly has a low density of trap states in some cases. Furthermore, a highly purified intrinsic or substantially highly purified intrinsic oxide semiconductor layer has an extremely low off-state current. Thus, a transistor whose channel region is formed in the oxide semiconductor layer has a small variation in electrical characteristics and high reliability in some cases.

Meanwhile, the source region 108s, the drain region 108d, and the oxide semiconductor layer 112 are in contact with the insulating layer 116. Hydrogen and/or nitrogen are/is added from the insulating layer 116 to the source region 108s, the drain region 108d, and the oxide semiconductor layer 112 in contact with the insulating layer 116, so that the carrier densities in the source region 108s, the drain region 108d, and the oxide semiconductor layer 112 are increased.

The carrier density of an oxide semiconductor layer will be described below.

Examples of a factor that affects the carrier density of an oxide semiconductor layer include oxygen vacancies (Vo) and impurities in the oxide semiconductor layer.

As the amount of oxygen vacancies in the oxide semiconductor layer increases, the density of defect states increases when hydrogen is bonded to the oxygen vacancies (this state is also referred to as VoH). The density of defect states also increases with an increase in the amount of impurities in the oxide semiconductor layer. Hence, the carrier density of the oxide semiconductor layer can be adjusted by controlling the density of defect states in the oxide semiconductor layer.

A transistor using the oxide semiconductor layer in a channel region will be described.

The carrier density of the oxide semiconductor layer is preferably reduced in order to suppress the negative shift of the threshold voltage of the transistor or reduce the off-state current of the transistor. In order to reduce the carrier density of the oxide semiconductor layer, the impurity concentration in the oxide semiconductor layer is reduced so that the density of defect states can be reduced. In this specification and the like, the state in which the impurity concentration is low and the density of defect states is low is referred to as "highly purified intrinsic" or "substantially highly purified intrinsic". The carrier density of a highly purified intrinsic oxide semiconductor layer is lower than $8 \times 10^{15}$ cm$^{-3}$, preferably lower than $1 \times 10^{11}$ cm$^{-3}$, more preferably lower than $1 \times 10^{10}$ cm$^{-3}$ and is higher than or equal to $1 \times 10^{-9}$ cm$^{-3}$.

In contrast, the carrier density of the oxide semiconductor layer is preferably increased in order to increase the on-state current of the transistor or improve the field-effect mobility of the transistor. In order to increase the carrier density of the oxide semiconductor layer, it is preferred that the impurity concentration or the density of defect states in the oxide semiconductor layer be slightly increased, or the bandgap of the oxide semiconductor layer be narrowed. For example, an oxide semiconductor layer that has a slightly high impurity concentration or a slightly high density of defect states in the range where a favorable on/off ratio is obtained in the Id-Vg characteristics of a transistor can be regarded as substantially intrinsic. Furthermore, an oxide semiconductor layer that has a high electron affinity and a narrow bandgap and thus has an increased density of thermally excited electrons (carriers) can be regarded as substantially intrinsic. Note that a transistor using an oxide semiconductor layer with higher electron affinity has a lower threshold voltage.

The oxide semiconductor layer with an increased carrier density has somewhat n-type conductivity; thus, it can be referred to as a "slightly-n" oxide semiconductor layer.

The carrier density of a substantially intrinsic oxide semiconductor layer is preferably higher than or equal to $1 \times 10^5$ cm$^{-3}$ and lower than $1 \times 10^{18}$ cm$^{-3}$, more preferably higher than or equal to $1 \times 10^7$ cm$^{-3}$ and lower than or equal to $1 \times 10^{17}$ cm$^{-3}$, still more preferably higher than or equal to $1 \times 10^9$ cm$^{-3}$ and lower than or equal to $5 \times 10^{16}$ cm$^{-3}$, yet more preferably higher than or equal to $1 \times 10^{10}$ cm$^{-3}$ and lower than or equal to $1 \times 10^{16}$ cm$^{-3}$, and yet still more preferably higher than or equal to $1 \times 10^{11}$ cm$^{-3}$ and lower than or equal to $1 \times 10^{15}$ cm$^{-3}$.

Figure 23:
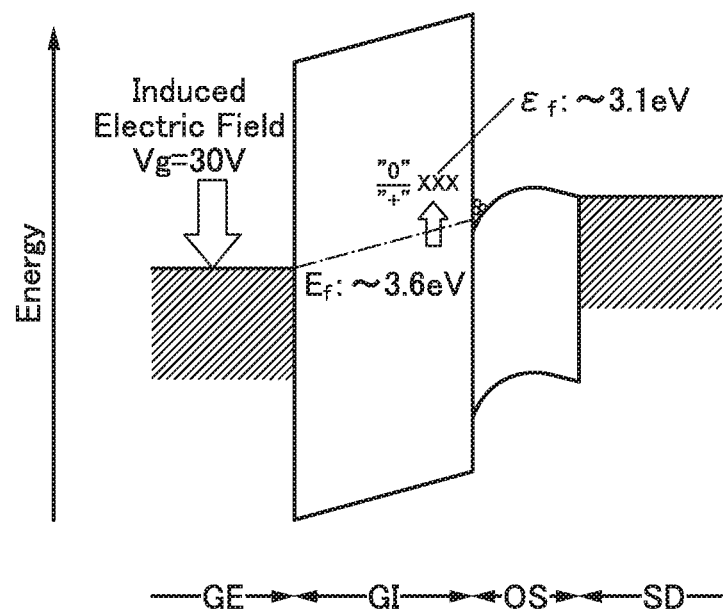
FIG. 23 is an energy band diagram of a transistor including an oxide semiconductor film in a channel region.

The use of the substantially intrinsic oxide semiconductor layer described above may improve the reliability of the transistor. Here, the reason why the transistor including the oxide semiconductor layer in a channel region has high reliability will be described with reference to FIG. 23. FIG. 23 is an energy band diagram of the transistor including the oxide semiconductor layer in the channel region.

In FIG. 23, GE stands for a gate electrode, GI stands for a gate insulating film, OS stands for an oxide semiconductor layer, and SD stands for a source electrode or a drain electrode. That is to say, FIG. 23 is an example of the energy band of the gate electrode, the gate insulating film, the oxide semiconductor layer, and the source electrode or the drain electrode in contact with the oxide semiconductor layer.

In FIG. 23, a silicon oxide film is used as the gate insulating film, and an In—Ga—Zn oxide is used for the oxide semiconductor layer. In addition, it is assumed that the transition level εf of a defect that can be formed in the silicon oxide film is located approximately 3.1 eV apart from the conduction band minimum of the gate insulating film, and the Fermi level Ef of the silicon oxide film at the interface between the oxide semiconductor layer and the silicon oxide film when the gate voltage Vg is 30 V is located approximately 3.6 eV apart from the conduction band minimum of the gate insulating film. Note that the Fermi level Ef of the silicon oxide film varies depending on the gate voltage. For example, as the gate voltage is increased, the Fermi level Ef of the silicon oxide film at the interface between the oxide semiconductor layer and the silicon oxide film becomes low. In FIG. 23, hollow circles indicate electrons (carriers), and symbols "X" indicate defect states in the silicon oxide film.

As illustrated in FIG. 23, for example, when the carriers are thermally excited under application of the gate voltage, the carriers are trapped in the defect states ("X" in the diagram), and the charge state of the defect states is changed from positive ("+") to neutral ("0"). Specifically, in the case where the value obtained by adding the thermal excitation energy to the Fermi level Ef of the silicon oxide film becomes greater than the transition level εf of the defect, the charge state of the defect states in the silicon oxide film is changed from positive to neutral, and the threshold voltage of the transistor is positively shifted.

When an oxide semiconductor layer with a different electron affinity is used, the Fermi level of the interface between the gate insulating film and the oxide semiconductor layer might be changed. When an oxide semiconductor layer with a greater electron affinity is used, the conduction band minimum of the gate insulating film is relatively high at the interface between the gate insulating film and the oxide semiconductor layer or in the vicinity of the interface. In that case, the defect states ("X" in FIG. 23) that can be formed in the gate insulating film are also located in a relatively high position; thus, the energy difference between the Fermi level of the gate insulating film and the Fermi level of the oxide semiconductor film is increased. This results in less charge trapped in the gate insulating film. For example, a change in the charge states of the defect states that can be formed in the silicon oxide film is smaller; thus, a change in the threshold voltage of the transistor due to gate bias temperature (GBT) stress can be smaller.

The above is the description of the carrier density of the oxide semiconductor layer.

As illustrated in FIG. 2C, the oxide semiconductor layer 108*i* faces the conductive layer 106 functioning as a first gate electrode and the oxide semiconductor layer 112 functioning as a second gate electrode. That is, the oxide semiconductor layer 108*i* is positioned between the conductive layer and the oxide semiconductor layer which function as gate electrodes.

Such a structure enables the oxide semiconductor layer 108 included in the transistor 100 to be electrically surrounded by an electric field due to a scan signal of the conductive layer 106 functioning as a first gate electrode and an electric field due to the constant voltage of the oxide semiconductor layer 112 functioning as a second gate electrode.

In the transistor 100, a scan signal for controlling the conduction state of the transistor 100 is supplied from the first gate electrode and the constant voltage is applied from the second gate electrode as illustrated in FIG. 1A. Since the constant voltage is applied to the wiring V0, the gate capacitance between the wiring V0 and the transistors M1 and M2 is negligible, and the gate capacitance between the scan line GL and the transistors can be reduced compared with the case where the first and second gate electrodes are connected to each other.

Furthermore, the conduction state of the transistor 100 is controlled by the scan line provided in the same layer as the first gate electrode. The first gate electrode is formed using the metal material. The metal material has a lower resistance than the metal oxide material of the oxide semiconductor layer 112 functioning as a second gate electrode, or the like. Thus, the resistance of the scan line formed using the same material as that of the conductive layer 106 can be low.

Furthermore, the transistor 100 includes the oxide semiconductor layer 112 functioning as a second gate electrode as a gate electrode that releases oxygen by being heated like an oxide layer. Thus, the transistor 100 has high reliability. Since the resistance of the conductive layer 106 functioning as a first gate electrode and the scan line located in the same layer as the conductive layer 106 can be reduced as described above, a disadvantage, high resistance of the second gate electrode, can be offset. Moreover, the number of steps can be reduced compared with the structure in which an oxide semiconductor layer and a metal wiring are stacked to reduce the resistance of the oxide semiconductor layer functioning as a second gate electrode; consequently, the manufacturing cost can be reduced.

Furthermore, the transistor 100 does not have an opening for connecting the first gate electrode and the second gate electrode. This can avoid the necessity for providing an opening in a small region like a pixel region. Thus, the transistor 100 is suitable for a high-definition display device.

[Example of Topside Structure]

Figure 4:
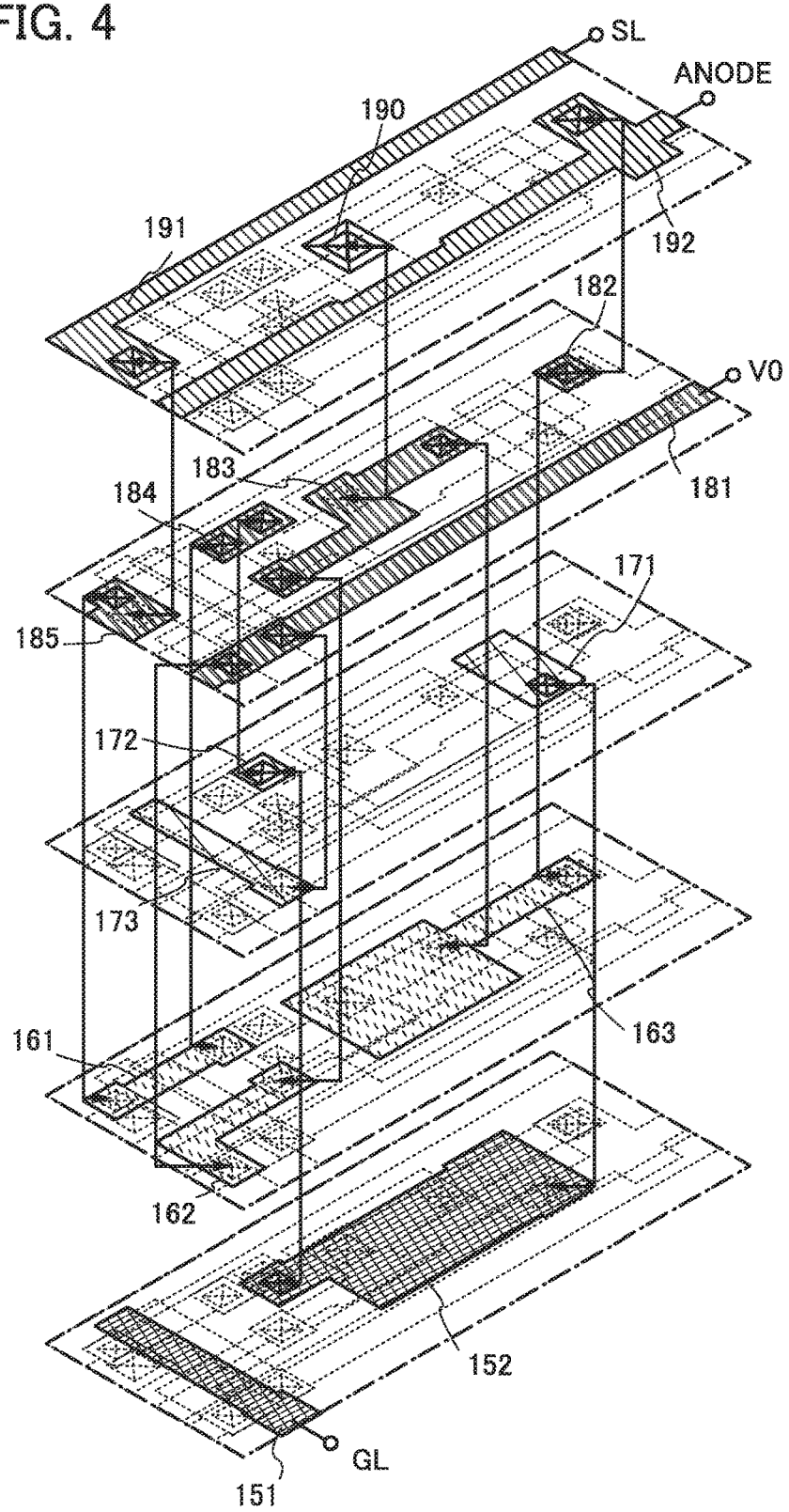
FIG. 4 is a perspective view of a display device of one embodiment.
Figure 6A:
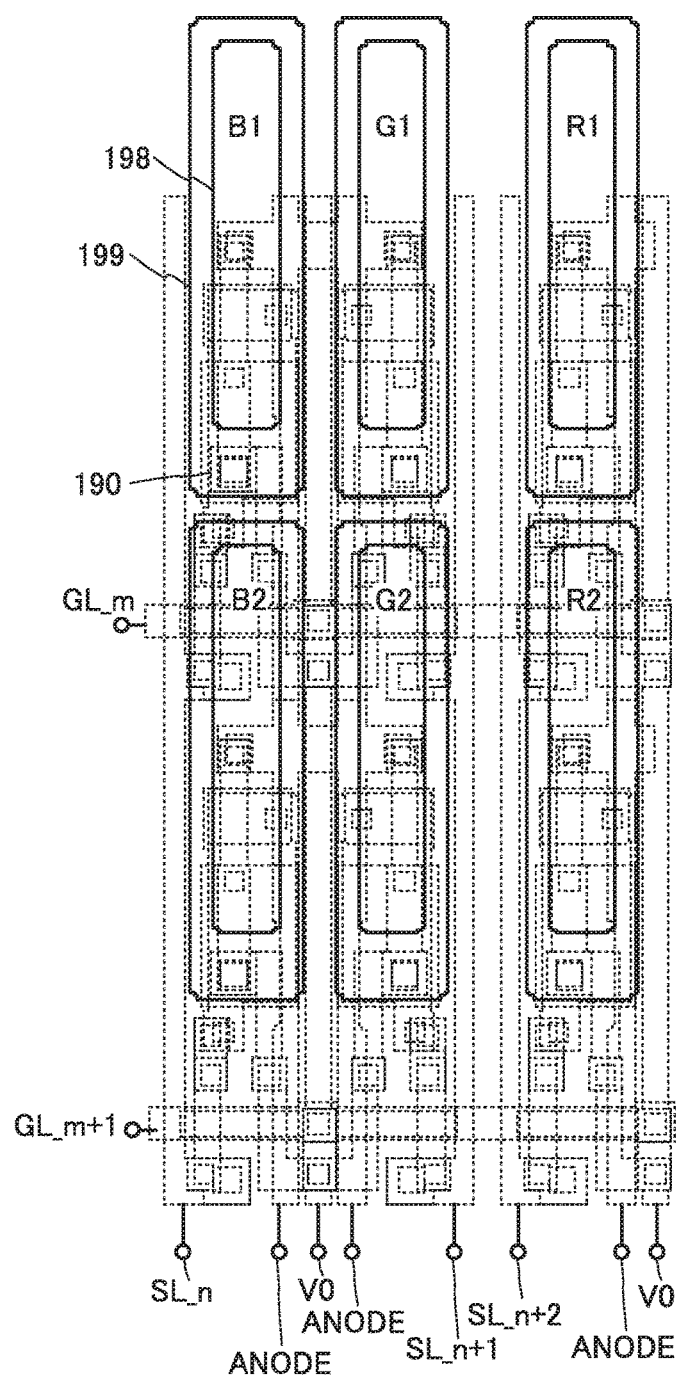
FIGS. 6A and 6B are top views of a display device of one embodiment.
Figure 6B:
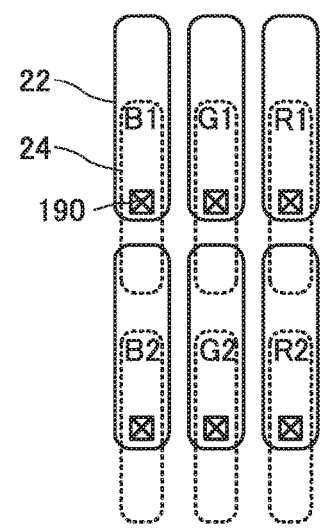

Next, FIG. 3 is an example of a top view that can be used for the circuit configuration in FIG. 1A except the structure of a light-emitting element and the like. FIG. 4 illustrates the state where a conductive layer, a semiconductor layer, and the like arranged up and down in the top view of FIG. 3 are separately shown and connected through openings. FIG. 5A is a cross-sectional view along the dotted line P1-P2 in FIG. 3, and FIG. 5B is a cross-sectional view along the dotted line Q1-Q2 in FIG. 3. FIGS. 6A and 6B are top views in which the top views of FIG. 3 including the structure of the light-emitting element and the like are arranged.

In the top view of FIG. 3, the scan line GL, the signal line SL, the wiring V0, the current supply line ANODE, the transistor M1, the transistor M2, a transistor M3, and the capacitor C1 are illustrated. Insulating layers and the like in the layered structure of the conductive layer and the oxide semiconductor layer are not illustrated.

The layered structure of the oxide semiconductor layer and the conductive layer forming the wirings and the like in FIG. 3 can be understood from FIG. 4 and FIGS. 5A and 5B. A conductive layer 151 and a conductive layer 152 functioning as first gate electrodes are provided over a substrate SUB. Then, an oxide semiconductor layer 161, an oxide semiconductor layer 162, and an oxide semiconductor layer 163 are provided thereover with an insulating layer 153 functioning as a first gate insulating layer therebetween. In addition, an oxide semiconductor layer 171, an oxide semiconductor layer 172, and an oxide semiconductor layer 173 functioning as second gate electrodes are provided thereover with an insulating layer 164 functioning as a second gate insulating layer therebetween. Then, a conductive layer 181, a conductive layer 182, a conductive layer 183, a conductive layer 184, and a conductive layer 185 functioning as source and drain electrodes of transistors and wirings are provided thereover with an insulating layer 174 therebetween. The insulating layer 174 selectively increases the carrier densities in the oxide semiconductor layer 161, the oxide semiconductor layer 162, and the oxide semiconductor layer 163 and the carrier densities in the oxide semiconductor layer 171, the oxide semiconductor layer 172, and the oxide semiconductor layer 173 to increase the conductivity of the oxide semiconductor layers. In addition, a conductive layer 191 and a conductive layer 192 are provided over the conductive layers 181, 182, 183, 184, and 185 with an insulating layer 186 and an insulating layer 187 functioning as interlayer insulating layers therebetween. An insulating layer 193 functioning as an interlayer insulating layer is provided over the conductive layers 191 and 192. In addition, an opening 190 is formed in the insulating layers 186, 187, and 193 so as to reach the conductive layer 183. The opening 190 is for connection between a pixel electrode formed later and a light-emitting element provided over the pixel electrode.

In FIGS. 3 and 4, squares with crosses indicate openings formed in the insulating layers. The conductive layers and the oxide semiconductor layers in separate layers are connected through the openings as shown by arrows in FIG. 4. In FIG. 4, the conductive layer 151 functioning as the scan line GL, the conductive layer 191 functioning as the signal line SL, the conductive layer 181 functioning as the wiring V0, and the conductive layer 192 functioning as the current supply line ANODE are illustrated.

As seen from FIG. 3, FIG. 4, and FIGS. 5A and 5B, the first gate electrode and the second gate electrode are not connected to each other in the transistors M1 and M2. Owing to the configuration, the gate capacitance between the scan line GL and the transistors M1 and M2 is formed only between the scan line GL and the first gate electrodes in contrast to the case where the first and second gate electrodes are connected to each other. Thus, the above configuration can reduce the gate capacitance between the scan line GL and the transistors compared with the case where the first and second gate electrodes are connected to each other.

Furthermore, as seen from FIG. 3, FIG. 4, and FIGS. 5A and 5B, the scan line GL that is formed with the metal material can be provided in the same layer as the first gate electrode in the transistors M1 and M2. Thus, even when the first gate electrode is formed with a conductive layer including the metal material and the second gate electrode is formed with a conductive layer including the metal oxide material such as an oxide semiconductor, a problem of an increase in the resistance of the scan line GL can be avoided. Moreover, manufacturing cost can be reduced by the cost for providing an extra wiring using a metal material to reduce the resistance of the scan line GL.

In addition, as seen from FIG. 3, FIG. 4, and FIGS. 5A and 5B, two electrodes of the capacitor C1 can be formed using the conductive layer 152 and the oxide semiconductor layer 163. Reducing the thickness of the insulating layer 153 between the two electrodes can increase the capacitance of the capacitor.

FIG. 6A is a top view of 2×3 subpixels for three colors (e.g., red (R), green (G), and blue (B)), each of which corresponds to the pixel illustrated in FIG. 3, FIG. 4, and FIGS. 5A and 5B. FIG. 6A illustrates subpixels (R1, R2, G1, G2, B1, and B2) arranged in two rows, an m-th row and an (m+1)-th row, and three columns, an n-th column, an (n+1)-th column, and an (n+2)-th column. FIG. 6A also illustrates a light-emitting layer 198 included in a light-emitting element EL and a partition layer 199 as well as the opening 190 described with reference to FIG. 3 to FIGS. 5A and 5B. FIG. 6A also illustrates a scan line GL_m in the m-th row, a scan line GL_m+1 in the (m+1)-th row, a signal line SL_n in the n-th column, a signal line SL_n+1 in the (n+1)-th column, a signal line SL_n+2 in the (n+2)-th column, the wiring V0, and the current supply line ANODE.

FIG. 6B is a schematic diagram of the top view in FIG. 6A. In FIG. 6B, the light-emitting layer 198, the partition layer 199, and the like are provided in a region 22, and a circuit including the transistors M1 and M3 and the like are provided in a region 24. As illustrated also in FIG. 6A, the opening 190 is located in the vicinity of the center of the region 24. The region 24 is located so as not to be aligned with the region 22, whereby the opening 190 can be located at an end portion of the region 22. This structure allows a light-emitting region to be provided regardless of the position of the opening 190.

[Modification Example]

A circuit configuration for which one embodiment of the present invention can be used is not limited to the pixel configuration including the transistors M1 to M3 in FIG. 1A. For example, one embodiment of the present invention can also be used for a pixel configuration including two or less transistors as in FIG. 7A.

Figure 7A:
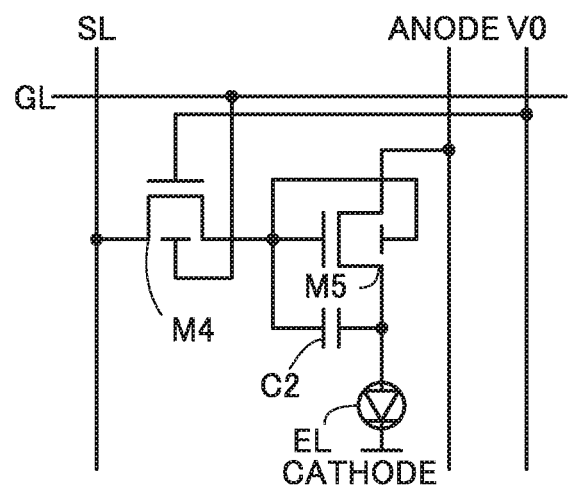
FIGS. 7A and 7B are circuit diagrams of a display device of one embodiment.

The pixel configuration illustrated in FIG. 7A includes a transistor M4, a transistor M5, a capacitor C2, and the light-emitting element EL. That is, the pixel configuration corresponds to the circuit configuration in FIG. 1A without the transistor M2.

Also in the configuration illustrated in FIG. 7A, a first gate electrode and a second gate electrode are not connected to each other in the transistor M4. Owing to the configuration, the gate capacitance between the scan line GL and the transistors is formed only between the scan line GL and the first gate electrodes in contrast to the case where the first and second gate electrodes are connected to each other. The gate capacitance between the wiring V0 and the transistor M4 is negligible because the constant voltage is applied to the wiring V0. Thus, the above configuration can reduce the gate capacitance between the scan line GL and the transistors compared with the case where the first and second gate electrodes are connected to each other. Furthermore, by controlling the constant voltage that is applied to the wiring V0, the threshold voltage of the transistor M4 can be adjusted.

Furthermore, in the above configuration, the scan line GL that is formed with the metal material can be provided in the same layer as the first gate electrode in the transistor M4. Thus, even when the first gate electrode is formed with a conductive layer including the metal material and the second gate electrode is formed with a conductive layer including the metal oxide material such as an oxide semiconductor, a problem of an increase in the resistance of the scan line GL can be avoided. Moreover, manufacturing cost can be reduced by the cost for providing an extra wiring using a metal material to reduce the resistance of the scan line GL.

Since in the above configuration, the first gate electrode can be formed with the conductive layer including the metal material and the second gate electrode can be formed with the conductive layer including the metal oxide material such as an oxide semiconductor, a gate electrode that releases oxygen by being heated is used as the second gate electrode, so that the reliability of the transistors can be improved. In addition, since the first gate electrode and the second gate electrode are not connected to each other in the transistor M4, which means that the gate electrodes are not connected to each other in a small region such as a pixel region, a high-definition display device can be fabricated.

A circuit configuration for which one embodiment of the present invention can be used is not limited to the pixel configurations in FIG. 1A and FIG. 7A. For example, one embodiment of the present invention can also be used for a pixel configuration including three or more transistors as in FIG. 7B.

Figure 7B:
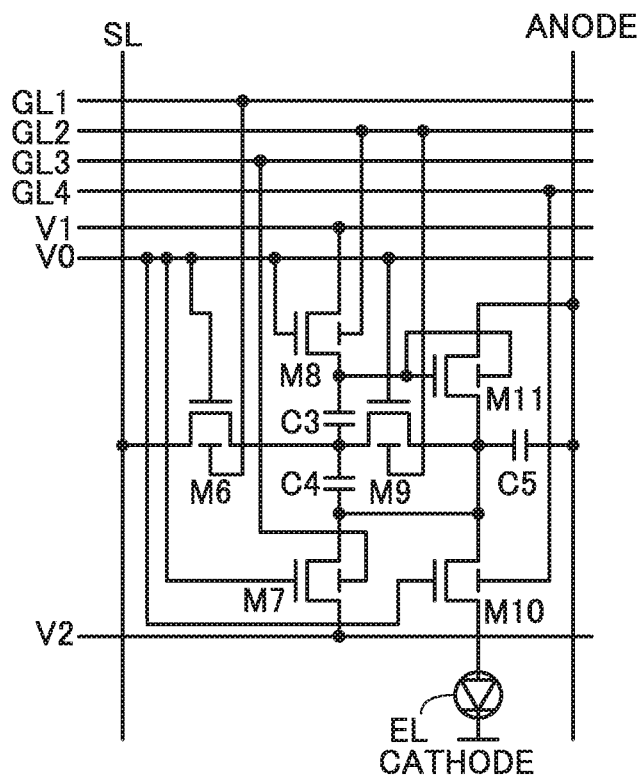

The pixel configuration illustrated in FIG. 7B includes a transistor M6, a transistor M7, a transistor M8, a transistor M9, a transistor M10, a transistor M11, a capacitor C3, a capacitor C4, a capacitor C5, and the light-emitting element EL. The pixel with this configuration is operated by the signal line SL, the current supply line ANODE, the wiring V0, the common wiring CATHODE, scan lines GL1 to GL4, and wirings V1 and V2. The wirings V1 and V2 are each a wiring to which a constant voltage is applied.

Also in the configuration illustrated in FIG. 7B, a first gate electrode and a second gate electrode are not connected to each other in the transistors M6 to M10. Owing to the configuration, the gate capacitance between the scan lines GL1 to GL4 and the transistors is formed only between the scan lines GL1 to GL4 and the first gate electrodes in contrast to the case where the first and second gate electrodes are connected to each other. The gate capacitance between the wiring V0 and the transistors M6 to M10 is negligible because the constant voltage is applied to the wiring V0. Thus, the above configuration can reduce the gate capacitance between the scan lines GL1 to GL4 and the transistors compared with the case where the first and second gate electrodes are connected to each other. Furthermore, by controlling the constant voltage that is applied to the wiring V0, the threshold voltage of the transistors M6 to M10 can be adjusted.

Furthermore, in the above configuration, the scan lines GL1 to GL4 that are formed with the metal material can be provided in the same layer as the first gate electrode in the transistors M6 to M10. Thus, even when the first gate electrode is formed with a conductive layer including the metal material and the second gate electrode is formed with a conductive layer including the metal oxide material such as an oxide semiconductor, a problem of an increase in the resistance of the scan lines GL1 to GL4 can be avoided. Moreover, manufacturing cost can be reduced by the cost for providing an extra wiring using a metal material to reduce the resistance of the scan lines GL1 to GL4.

Since in the above configuration, the first gate electrode can be formed with the conductive layer including the metal material and the second gate electrode can be formed with the conductive layer including the metal oxide material such as an oxide semiconductor, a gate electrode that releases oxygen by being heated is used as the second gate electrode, so that the reliability of the transistors can be improved. In addition, since the first gate electrode and the second gate electrode are not connected to each other in the transistors M6 to M10, which means that the gate electrodes are not connected to each other in a small region such as a pixel region, a high-definition display device can be fabricated.

Although the first gate electrode and the second gate electrode of the transistor M3 are not connected to each other in FIG. 1A, one embodiment of the present invention is not limited to this configuration. For example, the second gate electrode of the transistor M3 may be connected to the wiring V0 as illustrated in FIG. 8A.

Figure 8A:
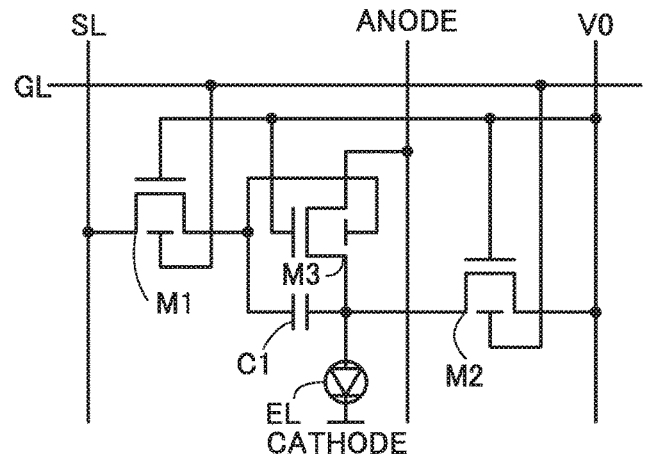
FIGS. 8A to 8C are each a circuit diagram of a display device of one embodiment.
Figure 8B:
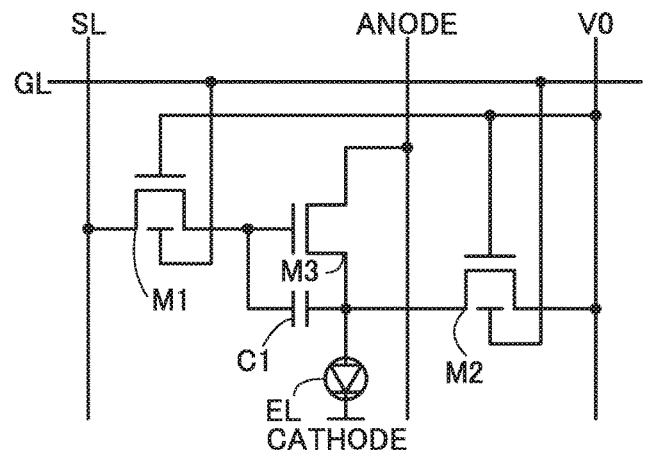

Alternatively, for example, the first gate electrode of the transistor M3 may be omitted as illustrated in FIG. 8B. Alternatively, for example, the first gate electrode of the transistor M3 may be connected to one of a source and a drain of the transistor M3 as illustrated in FIG. 8C.

Figure 8C:
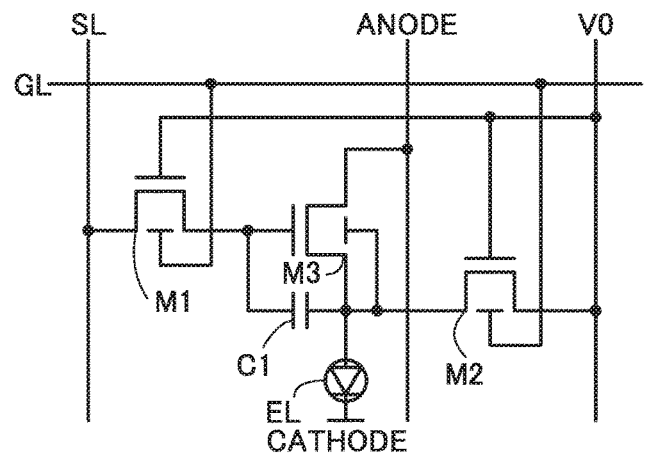

Also in the configurations illustrated in FIGS. 8A to 8C, the first gate electrode and the second gate electrode are not connected to each other in the transistors M1 and M2. Owing to the configuration, the gate capacitance between the scan line GL and the transistors is formed only between the scan line GL and the first gate electrodes in contrast to the case where the first and second gate electrodes are connected to each other. The gate capacitance between the wiring V0 and the transistors M1 and M2 is negligible because the constant voltage is applied to the wiring V0. Thus, the above configuration can reduce the gate capacitance between the scan line GL and the transistors compared with the case where the first and second gate electrodes are connected to each other. Furthermore, by controlling the constant voltage that is applied to the wiring V0, the threshold voltages of the transistors M1 and M2 can be adjusted.

Furthermore, in the above configuration, the scan line GL that is formed with the metal material can be provided in the same layer as the first gate electrode in the transistors M1 and M2. Thus, even when the first gate electrode is formed with a conductive layer including the metal material and the second gate electrode is formed with a conductive layer including the metal oxide material such as an oxide semiconductor, a problem of an increase in the resistance of the scan line GL can be avoided. Moreover, manufacturing cost can be reduced by the cost for providing an extra wiring using a metal material to reduce the resistance of the scan line GL.

Since in the above configuration, the first gate electrode can be formed with the conductive layer including the metal material and the second gate electrode can be formed with the conductive layer including the metal oxide material such as an oxide semiconductor, a gate electrode that releases oxygen by being heated is used as the second gate electrode, so that the reliability of the transistors can be improved. In addition, since the first gate electrode and the second gate electrode are not connected to each other in the transistors M1 and M2, which means that the gate electrodes are not connected to each other in a small region such as a pixel region, a high-definition display device can be fabricated.

Figure 24A:
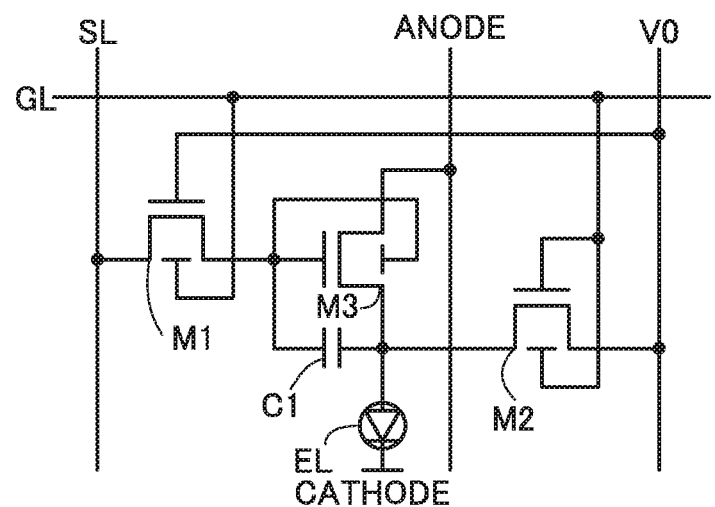
FIGS. 24A and 24B are each a circuit diagram of a display device of one embodiment.

Although both the second gate electrodes of the transistors M1 and M2 are connected to the wiring V0 in FIG. 1A, one embodiment of the present invention is not limited to this configuration. For example, as illustrated in FIG. 24A, the second gate electrode of the transistor M1 may be connected to the wiring V0, and the second gate electrode of the transistor M2 may be connected to the scan line GL. This configuration can increase the current supply capability of the transistor M2.

Figure 24B:
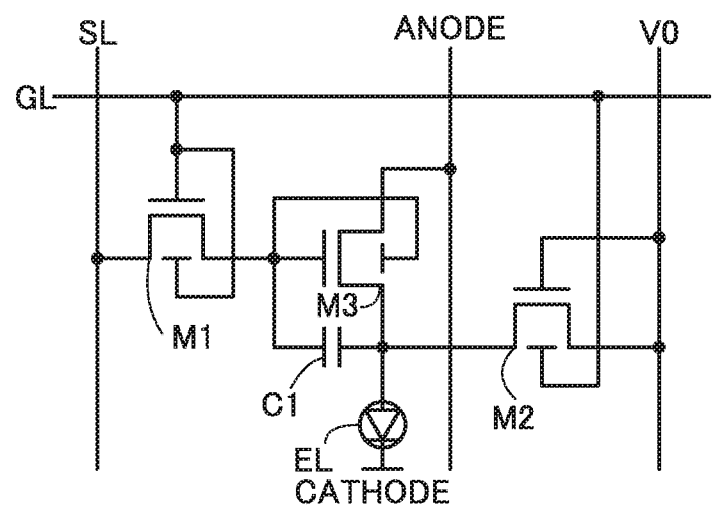

Alternatively, as illustrated in FIG. 24B, the second gate electrode of the transistor M2 may be connected to the wiring V0, and the second gate electrode of the transistor M1 may be connected to the scan line GL. This configuration can increase the current supply capability of the transistor M1.

Figure 25A:
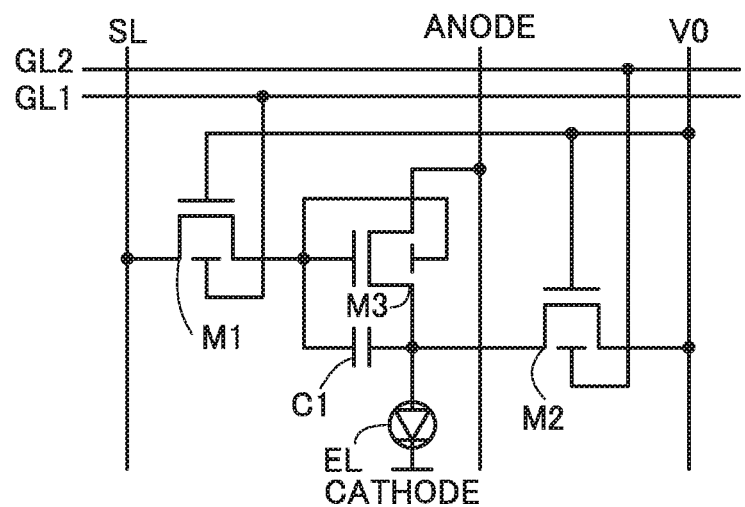
FIGS. 25A to 25B are each a circuit diagram of a display device of one embodiment.

Furthermore, instead of the scan line GL in FIG. 1A, the plurality of scan lines GL1 and GL2 may be provided. For example, as illustrated in FIG. 25A, the first gate electrode of the transistor M1 may be connected to the scan line GL1, and the first gate electrode of the transistor M2 may be connected to the scan line GL2.

Figure 25B:
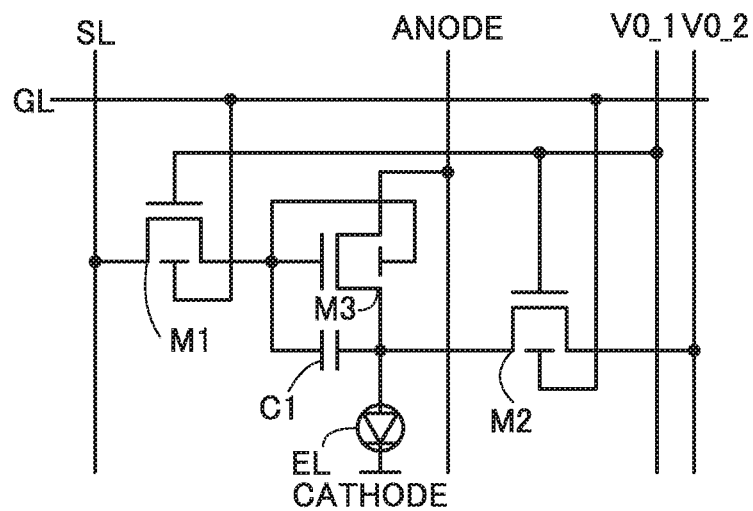

Furthermore, instead of the wiring V0 in FIG. 1A, a plurality of wirings V0_1 and V0_2 may be provided. For example, as illustrated in FIG. 25B, the second gate electrode of the transistor M1 may be connected to the wiring V0_1, and the second gate electrode of the transistor M2 may be connected to the wiring V0_1.

At least part of this embodiment can be implemented in combination with any of the other embodiments described in this specification as appropriate.

(Embodiment 2)

In this embodiment, an example of a cross-sectional structure of a display device of one embodiment of the present invention will be described.

[Structure Example of Display Device]

Figure 9:
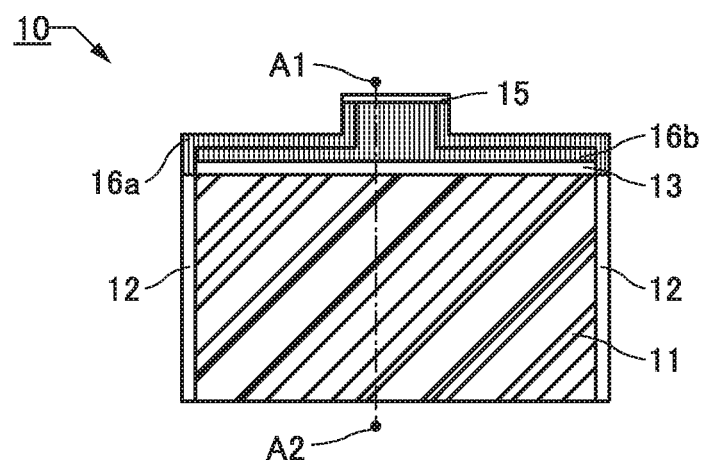
FIG. 9 illustrates a structure example of a display device of one embodiment.

FIG. 9 is a schematic top view of a display device 10 described below. The display device 10 includes a pixel portion 11, a scan line driver circuit 12, a signal line driver circuit 13, a terminal portion 15, a plurality of wirings 16a, a plurality of wirings 16b, and the like.

[Cross-Sectional Structure Example 1-1]

Figure 10:
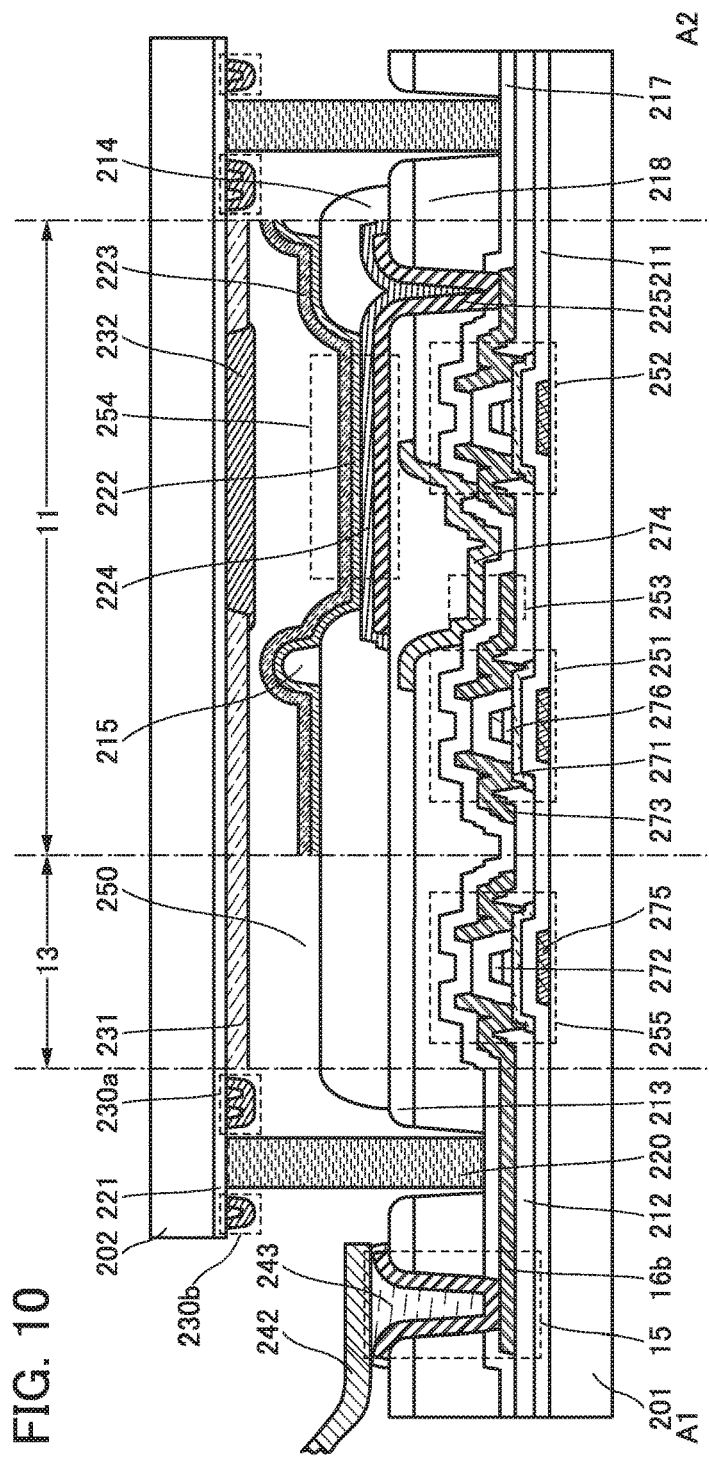
FIG. 10 illustrates a structure example of a display device of one embodiment.

FIG. 10 is a schematic cross-sectional view of the display device 10. FIG. 10 shows a cross section taken along the section line A1-A2 of FIG. 9.

The display device 10 includes a first substrate 201 and a second substrate 202 which are bonded to each other with a bonding layer 220.

The terminal portion 15, the wiring 16b; a transistor 255 that is included in the signal line driver circuit 13, transistors 251 and 252, a capacitor 253, and a light-emitting element 254 that are included in the pixel portion 11, and the like are provided over the first substrate 201. In addition, insulating layers 211, 212, 213, and 214, a spacer 215, and the like are provided over the first substrate 201.

On the first substrate 201 side of the second substrate 202, an insulating layer 221, a light-blocking layer 231, a coloring layer 232, structures 230a and 230b, and the like are provided.

The light-emitting element 254 is provided over the insulating layer 213. The light-emitting element 254 includes a pixel electrode 225 serving as a first electrode, an EL layer 222, and a second electrode 223. An optical adjustment layer 224 is provided between the pixel electrode 225 and the EL layer 222. The insulating layer 214 covers end portions of the pixel electrode 225 and the optical adjustment layer 224.

The transistor 251 functions as the transistor M1 or M2 described in Embodiment 1 with reference to FIG. 1A. The transistor 252 functions as the transistor M3 described in Embodiment 1 with reference to FIG. 1A.

The transistor 251, the transistor 252, and a transistor 255 are provided with a conductive layer 275 functioning as a first gate electrode and a conductive layer 272 functioning as a second gate electrode. Specifically, a semiconductor in which a channel is formed is sandwiched between the two gate electrodes. The conductive layer 275 corresponds to the conductive layer 106 functioning as a first gate electrode described in Embodiment 1 with reference to FIGS. 2A to 2C. The conductive layer 272 corresponds to the oxide semiconductor layer 112 functioning as a second gate electrode described in Embodiment 1 with reference to FIGS. 2A to 2C.

When the conductive layer 275 is used as an electrode that releases oxygen so that oxygen vacancies in the semiconductor layer 271 can be filled, the electrical characteristics of the transistors can be stable.

In the transistor connected to a light-emitting element, like the transistor 252, two gate electrodes are preferably electrically connected to each other so as to be supplied with the same signal. Such a transistor can have higher field-effect mobility and thus have higher on-state current than other transistors. Consequently, a circuit capable of high-speed operation can be obtained.

Although the capacitor 253 is formed of part of a conductive layer 274, part of an insulating layer 217, and part of a conductive layer 273 as illustrated in FIG. 10, the capacitor 253 can be formed of part of the conductive layer 275, part of the insulating layer 211, and part of the semiconductor layer 271.

The light-emitting element 254 in the example illustrated in FIG. 10 is a top-emission light-emitting element. Light emission from the light-emitting element 254 is extracted from the second substrate 202 side. Such a structure enables the transistors, the capacitors, the circuits, the wirings, and the like to be provided below the light-emitting element 254 (i.e., on the first substrate 201 side), leading to an increase in the aperture ratio of the pixel portion 11.

The coloring layer 232 overlapping with the light-emitting element 254 is provided on the surface of the second substrate 202 on the first substrate 201 side. The light-blocking layer 231 may be provided in a region where the coloring layer 232 is not provided. The light-blocking layer 231 may overlap with the signal line driver circuit 13 as illustrated in FIG. 10. In addition, a light-transmitting overcoat layer may be provided to cover the coloring layer 232 and the light-blocking layer 231.

On the first substrate 201 side of the second substrate 202, the structure 230a is located inward from the bonding layer 220, and the structure 230b is located outward from the bonding layer 220. The structures 230a and 230b each have a function of suppressing development of a crack in the insulating layer 221, the second substrate 202, or the like at the end portions of the second substrate 202. The structures 230a and 230b in the example of FIG. 10 have layered structures including a layer formed of the same film as the light-blocking layer 231 and a layer formed of the same film as the coloring layer 232. Such a layered structure including two or more layers can increase the effect of suppressing crack development. Although the structures 230a and 230b are provided on both sides of the bonding layer 220, either one of the structures 230a and 230b may be provided on one side of the bonding layer 220. When there is no possibility of cracks (e.g., when the second substrate 202 possesses high stiffness), the structures 230a and 230b may be omitted.

The spacer 215 is provided over the insulating layer 214. The spacer 215 serves as a gap spacer for preventing the distance between the first substrate 201 and the second substrate 202 from excessively decreasing. The angle between part of the side surface of the spacer 215 and the surface where the spacer 215 is formed is preferably more than or equal to 45° and less than or equal to 120°, more preferably more than or equal to 60° and less than or equal to 100°, still more preferably more than or equal to 75° and less than or equal to 90°. Owing to this structure, a region of the EL layer 222 with a small thickness can be easily formed on the side surface of the spacer 215. This can prevent undesired emission due to a current that flows through the EL layer 222 between adjacent light-emitting elements. Providing the spacer 215 having such a shape between light-emitting elements is effective particularly when the pixel portion 11 has high definition because the distance between adjacent light-emitting elements is reduced. Furthermore, that is effective particularly when the EL layer 222 includes a layer containing highly conductive material, for example.

In the case where a blocking mask is used in the formation of the EL layer 222, the second electrode 223, and the like, the spacer 215 may have a function of protecting the formation surface from flaws due to the blocking mask.

The spacer 215 preferably overlaps with the wiring which intersects with a scan line.

A color filter method is used for the display device 10 shown in FIG. 10. For example, a structure in which one color is expressed by subpixels each including the coloring layer 232 of any of red (R), green (G), and blue (B) may be used. In addition, subpixels for white (W) and yellow (Y) are preferably used because the color reproducibility can be improved and power consumption can be reduced.

Owing to the combination of the coloring layer 232 and a microcavity structure using the optical adjustment layer 224 in the light-emitting element 254, light with high color purity can be extracted from the display device 10. The thickness of the optical adjustment layer 224 is determined depending on the color of a subpixel. The optical adjustment layer may be omitted in some subpixels.

An EL layer that emits white light is preferably used as the EL layer 222 of the light-emitting element 254. The use of the light-emitting element 254 eliminates the need of separately coloring the EL layers 222 of the subpixels, which leads to a reduction in cost and an increase in yield. In addition, the pixel portion 11 can be easily formed with high resolution. The subpixels may include optical adjustment layers having different thicknesses so that the EL layers 222 in the subpixels are separately colored, in which case one or both of the optical adjustment layer and the coloring layer can be omitted. In that case, layers in the subpixels are not necessarily colored separately except light-emitting layers of the EL layers 222.

In the example shown in FIG. 10, an FPC 242 is electrically connected to the terminal portion 15. Thus, the display device 10 shown in FIG. 10 can be referred to as a display module. A display device without an FPC or the like can be referred to as a display panel.

The terminal portion 15 is electrically connected to the FPC 242 through the connection layer 243.

The terminal portion 15 shown in FIG. 10 has a layered structure including the wiring 16b and a conductive layer formed of the same conductive film as the pixel electrode 225. The terminal portion 15 preferably has a layered structure including a plurality of conductive layers because not only a reduction in electric resistance but also an increase in mechanical strength can be achieved.

It is preferred that the insulating layer 211 and the insulating layer 221 be formed using a material through which impurities such as water and hydrogen do not easily diffuse. That is, the insulating layer 211 and the insulating layer 221 can serve as barrier films. With such a structure, entry of impurities from the outside into the light-emitting element 254, the transistors, and the like can be effectively inhibited even when a moisture-permeable material is used for the first substrate 201 and the second substrate 202, which leads to a highly reliable display device.

The example shown in FIG. 10 has a sealed hollow structure including a space 250 between the first substrate 201 and the second substrate 202. For example, the space 250 may be filled with an inert gas such as nitrogen or a rare gas. The space 250 may be filled with a fluid material such as oil, or the pressure in the space 250 may be reduced. The sealing method is not limited thereto, and solid sealing using a resin or the like may be used.

[Cross-Sectional Structure Example 2]

Figure 11:
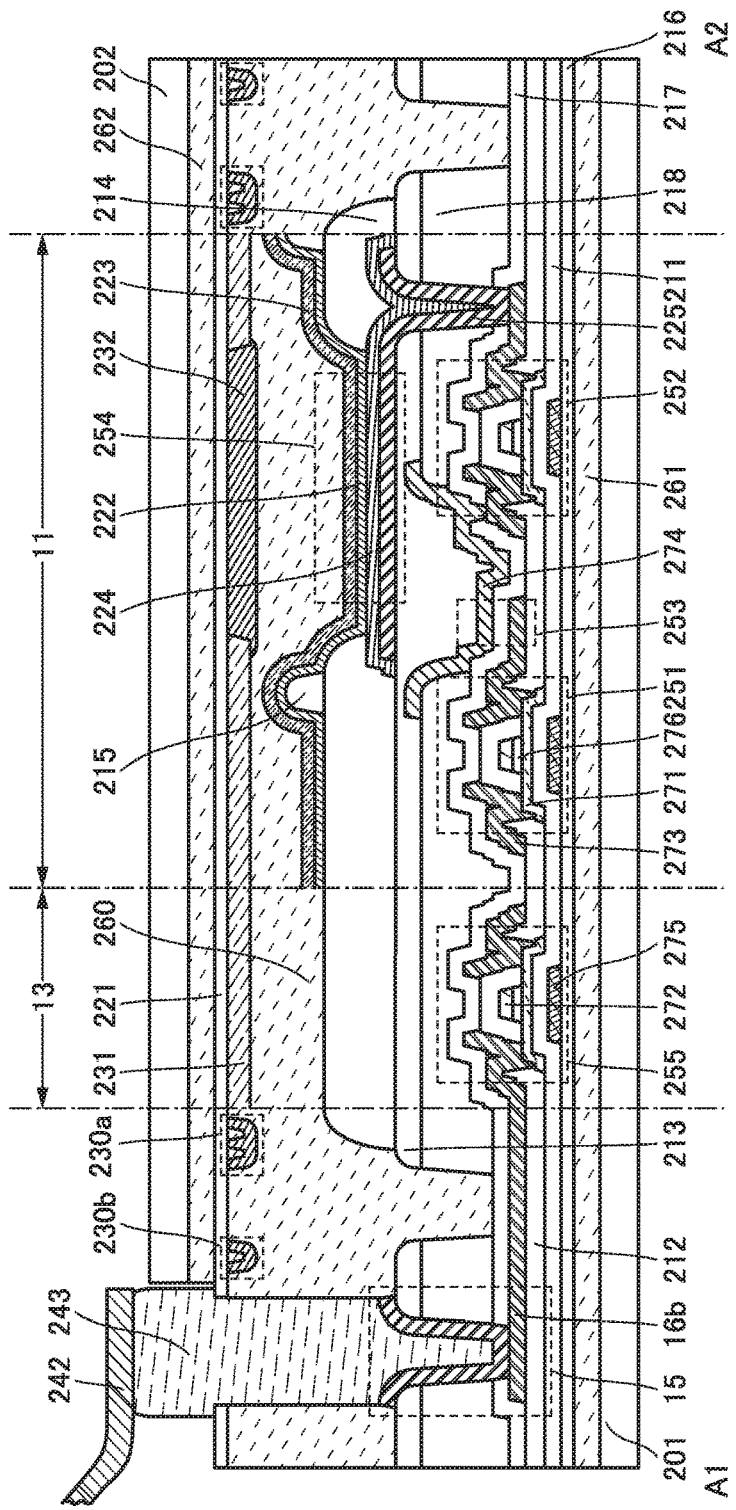
FIG. 11 illustrates a structure example of a display device of one embodiment.

FIG. 11 is a structure example of a display device which is suitable when the pixel portion 11 and the signal line driver circuit 13 are bent and used.

The display device 10 shown in FIG. 11 has a solid sealing structure in which the first substrate 201 and the second substrate 202 are bonded to each other with a sealant 260.

A bonding layer 261 is provided over the first substrate 201. An insulating layer 216 is provided over the bonding layer 261. A transistor, a light-emitting element, and the like are provided over the insulating layer 216. The insulating layer 216 is preferably formed using a material through which impurities such as water or hydrogen do not easily diffuse, like the insulating layer 221.

A bonding layer 262 is provided between the second substrate 202 and the insulating layer 221.

As shown in FIG. 11, the insulating layer 213 has an opening located in a portion closer to the outer end of the first substrate 201 than the pixel portion 11 and the signal line driver circuit 13. It is preferable to form an opening in the insulating layer 213 formed using a resin material, for example, so as to surround the pixel portion 11, the signal line driver circuit 13, and the like. In such a structure, the vicinity of the side surface of the insulating layer 213 which is in contact with the outside of the display device 10 does not form a continuous layer with the region overlapping with the pixel portion 11, the signal line driver circuit 13, and the like, so that diffusion of impurities, such as water and hydrogen, from the outside through the insulating layer 213 can be inhibited.

The solid sealing structure shown in FIG. 11 makes it easier to keep the distance between the first substrate 201 and the second substrate 202 constant. Thus, flexible substrates can be preferably used as the first substrate 201 and the second substrate 202. As a result, part of or the whole of the pixel portion 11, the scan line driver circuit 12, and the signal line driver circuit 13 can be bent when used. For example, the display device 10 can be bonded to a curved surface or the pixel portion of the display device 10 can be folded to produce electronic devices with a variety of structures.

[Modification Example]

An example of a touch panel including a touch sensor will be described below.

Figure 12:
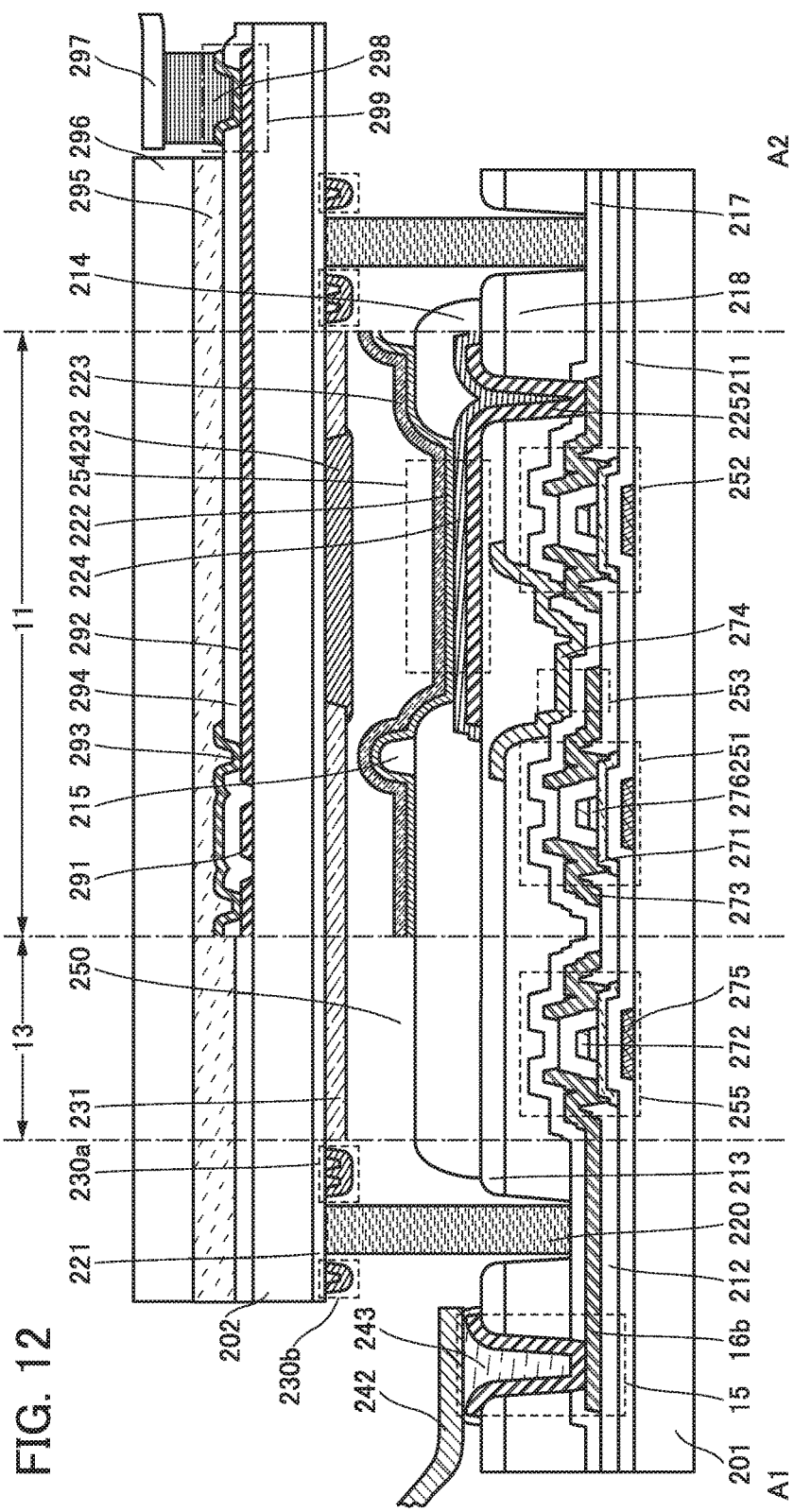
FIG. 12 illustrates a structure example of a touch panel of one embodiment.

FIG. 12 shows an example of a touch panel in which an on-cell touch sensor is used in the structure shown as an example in FIG. 10.

Over the second substrate 202, a conductive layer 291 and a conductive layer 292 are covered with an insulating layer 294. A conductive layer 293 is provided over the insulating layer 294. The conductive layer 293 is electrically connected, through an opening of the insulating layer 294, to two conductive layers 292 between which the conductive layer 291 is provided. The insulating layer 294 is bonded to a substrate 296 with a bonding layer 295.

The amount of the capacitance formed between the conductive layers 291 and 292 changes with the approach of an object, so that the approach or contact of the object can be sensed. A lattice arrangement of the plurality of conductive layers 291 and the plurality of conductive layers 292 allows location information to be obtained.

A terminal portion 299 is provided in the vicinity of the outer end of the second substrate 202. The terminal portion 299 is electrically connected to an FPC 297 through a connection layer 298.

The substrate 296 here can be used also as a substrate with which an object, such as a finger or a stylus, is to be in contact. In that case, a protective layer (such as a ceramic coat) is preferably provided over the substrate 296. The protective layer can be formed using an inorganic insulating material such as silicon oxide, aluminum oxide, yttrium oxide, or yttria-stabilized zirconia (YSZ). Alternatively, tempered glass may be used as the substrate 296. Physical or chemical processing by an ion exchange method, a wind tempering method, or the like may be performed on tempered glass so that compressive stress is applied on the surface. In the case where the touch sensor is provided on one side of tempered glass and the opposite side of the tempered glass is provided on, for example, the outermost surface of an electronic device for use as a touch surface, the thickness of the whole device can be decreased.

As the touch sensor, a capacitive touch sensor can be used. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the approach or contact of an object, such as a finger or a stylus, can be used.

The above example shows an on-cell touch panel in which a wiring and the like composing a touch sensor are formed on the outer surface of the second substrate 202; there is no need to limit to the structure. For example, an external touch panel or an in-cell touch panel can be employed. The use of the on-sell or in-cell touch panel allows a reduction in the thickness of a display panel even when the display panel has a touch-panel function.

The above is the description of the cross-sectional structure examples.

[Components]

The above components will be described below.

[Substrate]

A substrate having a flat surface can be used as the substrate included in the display device. The substrate through which light emitted from the light-emitting element is extracted is formed using a material that transmits the light. For example, a material such as glass, quartz, ceramic, sapphire, or an organic resin can be used.

The weight and thickness of the display device can be reduced using a thin substrate. Furthermore, a flexible display device can be obtained using a substrate that is thin enough to have flexibility.

As the glass, for example, alkali-free glass, barium borosilicate glass, aluminoborosilicate glass, or the like can be used.

Examples of a material having flexibility and transmitting visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. Alternatively, a substrate in which a glass fiber is impregnated with an organic resin or a substrate whose thermal expansion coefficient is reduced by mixing an organic resin with an inorganic filler can be used. A substrate using such a material is lightweight, and thus, a display device using this substrate can also be lightweight.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display device.

Although there is no particular limitation on a material of the metal substrate, it is preferable to use, for example, a metal such as aluminum, copper, or nickel, or an alloy such as an aluminum alloy or stainless steel.

It is possible to use a substrate subjected to insulation treatment in such a manner that a surface of a metal substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposure to or heating in an oxygen atmosphere, or the like.

A hard coat layer (e.g., a silicon nitride layer) by which a surface of the display device is protected from damage, a layer (e.g., an aramid resin layer) that can disperse pressure, or the like may be stacked over the flexible substrate. Furthermore, to suppress a decrease in the lifetime of the light-emitting element due to moisture and the like, an insulating film with low water permeability may be stacked over the flexible substrate. For example, an inorganic insulating material such as silicon nitride, silicon oxynitride, aluminum oxide, or aluminum nitride can be used.

The substrate may be formed by stacking a plurality of layers. In particular, when a glass layer is used, a barrier property against water and oxygen can be improved, and thus, a highly reliable display device can be provided. For example, a substrate in which a glass layer, a bonding layer, and an organic resin layer are stacked in this order from the side closer to the light-emitting element can be used. By providing such an organic resin layer, a crack or a break in the glass layer can be suppressed and mechanical strength can be improved. The use of such a composite material of a glass material and an organic resin for the substrate enables fabrication of a highly reliable and flexible display device.

[Transistor]

The transistor included in the display device includes a conductive layer functioning as a front gate electrode, a conductive layer functioning as a back gate electrode, the semiconductor layer, a conductive layer functioning as a source electrode, a conductive layer functioning as a drain electrode, and an insulating layer functioning as a gate insulating layer.

That is, in the transistor included in the display device of one embodiment of the present invention, gate electrodes are provided over and under a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the semiconductor layer of the transistor, an oxide semiconductor can be used, for example. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). The oxide semiconductor more preferably includes an In-M-Zn-based oxide (M is a metal such as Al, Ti, Ga, Ge, Y, Zr, Sn, La, Ce, or Hf).

As the semiconductor layer, it is particularly preferable to use an oxide semiconductor layer including a plurality of crystal parts whose c-axes are aligned substantially perpendicularly to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor layer which is caused by stress when a display panel is bent is prevented. Consequently, such an oxide semiconductor can be preferably used for a flexible display device which is used in a bent state, or the like.

Moreover, the use of such an oxide semiconductor with crystallinity for the semiconductor layer makes it possible to provide a highly reliable transistor in which a variation in electrical characteristics is suppressed.

A transistor with an oxide semiconductor whose band gap is larger than that of silicon can hold charge accumulated in a capacitor that is serially-connected to the transistor for a long time, owing to the low off-state current of the transistor. When such a transistor is used for a pixel, operation of a driver circuit can be stopped while the gray scale of each pixel is maintained. As a result, a display device with extremely low power consumption can be obtained.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting material that can be used for the conductive layers serving as the wirings and electrodes in the display device, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased.

[Insulating Layer]

As an insulating material that can be used for the insulating layers, the overcoat, the spacer, and the like, a resin such as acrylic or epoxy, a resin having a siloxane bond, such as a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

[Bonding Layer, Sealant]

As the bonding layer and the sealant, a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred.

Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into a functional element, leading to an improvement in the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, or zirconium can be used.

[Light-Emitting Element]

As the light-emitting element, a self-luminous element can be used, and an element whose luminance is controlled by current or voltage is included in the category of the light-emitting element. For example, a light-emitting diode (LED), an organic EL element, or an inorganic EL element can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may alternatively be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, light-emitting substances are selected such that two or more light-emitting substances emit complementary colors to obtain white light emission. Specifically, it is preferable to use two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). The emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as that in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

For the conductive film that transmits visible light, for example, indium oxide, indium tin oxide (ITO), indium zinc oxide, zinc oxide, or zinc oxide to which gallium is added can be used. Alternatively, a film of a metal material such as gold, silver, platinum, magnesium, nickel, tungsten, chromium, molybdenum, iron, cobalt, copper, palladium, or titanium, an alloy containing any of these metal materials, a nitride of any of these metal materials (e.g., titanium nitride), or the like can be used when formed thin enough to have a light-transmitting property. Alternatively, a layered film of any of the above materials can be used as the conductive layer. For example, a layered film of ITO and an alloy of silver and magnesium is preferably used because the conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy), such as an alloy of aluminum and titanium, an alloy of aluminum and nickel, or an alloy of aluminum and neodymium, or an alloy containing silver, such as an alloy of silver and copper, an alloy of silver, palladium, and copper, or an alloy of silver and magnesium can be used for the conductive film. An alloy containing silver and copper is preferable because of its high heat resistance. Furthermore, when a metal film or a metal oxide film is stacked in contact with an aluminum alloy film, oxidation of the aluminum alloy film can be suppressed. Examples of a material for the metal film or the metal oxide film include titanium and titanium oxide. Alternatively, the above conductive film that transmits visible light and a film containing a metal material may be stacked. For example, a layered film of silver and ITO or a layered film of an alloy of silver and magnesium and ITO can be used.

The conductive layers may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, a metal oxide, and a composite oxide containing a solid solution of a plurality of metal oxides. A stack of films containing the material for the coloring layer can also be used for the light-blocking layer. For example, a layered structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

[Connection Layer]

As a connection layer connecting an FPC or an IC and a terminal, an anisotropic conductive film (ACF), an anisotropic conductive paste (ACP), or the like can be used.

The above is the description of the components.

At least part of this embodiment can be implemented in combination with any of the other embodiments described in this specification as appropriate.

(Embodiment 3)

In this embodiment, an example of a manufacturing method of a display device including a flexible substrate will be described.

Here, layers including a light-emitting element, a circuit, a wiring, an electrode, an insulating layer, optical members such as a coloring layer and a light-blocking layer, and the like are collectively referred to as an element layer. The element layer includes, for example, a light-emitting element, and may additionally include a wiring electrically connected to the light-emitting element or an element such as a transistor used in a pixel or a circuit.

In addition, here, a flexible member which supports the element layer at a stage at which the light-emitting element is completed (the manufacturing process is finished) is referred to as a substrate. Examples of the substrate include an extremely thin film with a thickness greater than or equal to 10 nm and less than or equal to 300 µm and the like.

As a method for forming an element layer over a flexible substrate provided with an insulating surface, typically, there are two methods shown below. One of them is to directly form an element layer over a flexible substrate. The other method is to form an element layer over a support substrate that is different from a flexible substrate and then to separate the element layer from the support substrate to transfer the element layer to the substrate. In addition to the above two methods, there is a method in which an element layer is formed over a substrate which does not have flexibility and the substrate is thinned by polishing or the like to have flexibility, though the details are not described here.

In the case where a material of the substrate can withstand heating temperature in a process for forming the element layer, It is preferred that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over a support substrate and then transferred to a substrate, first, a separation layer and an insulating layer are stacked over the support substrate, and then the element layer is formed over the insulating layer. Next, the element layer is separated from the support substrate and then transferred to the substrate. At this time, a material is selected such that separation occurs at the interface between the support substrate and the separation layer, at the interface between the separation layer and the insulating layer, or in the separation layer. In the method, It is preferred that a material having high heat resistance be used for the support substrate or the separation layer, in which case the upper limit of the temperature applied when the element layer is formed can be higher, and an element layer including a more reliable element can be formed.

For example, a stacked layer of a layer containing a high-melting-point metal material, such as tungsten, and a layer containing an oxide of the metal material is used as the separation layer. Furthermore, a stacked layer of a plurality of layers, such as a silicon oxide layer, a silicon nitride layer, a silicon oxynitride layer, a silicon nitride oxide layer, and the like is preferably used as the insulating layer over the separation layer. Note that in this specification, oxynitride contains more oxygen than nitrogen, and nitride oxide contains more nitrogen than oxygen.

The element layer and the support substrate can be separated by applying mechanical force, by etching the separation layer, by making a liquid permeate the separation interface, or the like. Alternatively, separation can be performed by heating or cooling two layers of the separation interface to utilize a difference in thermal expansion coefficient.

When separation is started, It is preferred that a separation trigger be formed first so that the separation proceeds from the trigger. The separation trigger can be formed, for example, by locally heating part of the insulating layer or the separation layer with laser light or the like or by physically cutting or making a hole through part of the insulating layer or the separation layer with a sharp tool.

The separation layer is not necessarily provided in the case where the separation can be performed at the interface between the support substrate and the insulating layer.

For example, glass is used for the support substrate and an organic resin such as polyimide is used for the insulating layer, in which case separation can be performed at the interface between the glass and the organic resin. The remaining organic resin such as polyimide can be used for the substrate.

Alternatively, a heat generation layer may be provided between the support substrate and the insulating layer formed of an organic resin, and separation may be performed at the interface between the heat generation layer and the insulating layer by heating the heat generation layer. As the heat generation layer, any of a variety of materials such as a material that generates heat by current supply, a material that generates heat by absorbing light, and a material that generates heat by application of a magnetic field can be used. For example, a semiconductor, a metal, or an insulator can be selected for the heat generation layer.

An example of a specific manufacturing method will be described below. The manufacturing method described below enables fabrication of a flexible input/output device of one embodiment of the present invention by changing a layer formed as a layer to be separated.

Figure 13A:
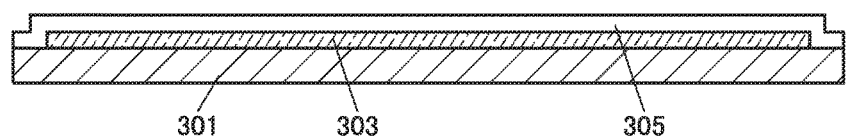
FIGS. 13A to 13D illustrate a method for manufacturing a display device of one embodiment.
Figure 13B:
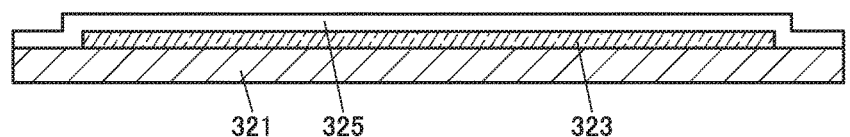

First, a formation substrate 301 is provided with an island-shaped separation layer 303. Then, the separation layer 303 is provided with a layer 305 to be separated (FIG. 13A). In addition, a formation substrate 321 is provided with an island-shaped separation layer 323. Then, the separation layer 323 is provided with a layer 325 to be separated (FIG. 13B).

Although an example in which the separation layer is formed to have an island shape is described here, one embodiment of the present invention is not limited to this example. In this step, as the material for the separation layer, a material that allows separation at the interface between the formation substrate and the separation layer, the interface between the separation layer and the layer to be separated, or in the separation layer when the layer to be separated is separated from the formation substrate. Although an example in which separation occurs at the interface between the separation layer and the layer to be separated is described in this embodiment, one embodiment of the present invention is not limited to such an example and depends on materials used for the separation layer and the layer to be separated. Note that in the case where the layer to be separated has a layered structure, a layer in contact with the separation layer is particularly referred to as a first layer.

For example, when the separation layer has a layered structure of a tungsten film and a tungsten oxide film and separation occurs at the interface between the tungsten film and the tungsten oxide film (or the vicinity of the interface), part of the separation layer (here, part of the tungsten oxide film) may remain on the separated layer. Moreover, the separation layer remaining on the separated layer may be removed after separation.

As the formation substrate, a substrate having at least heat resistance enough to withstand process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

In the case where a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. The crystal structure of a layer containing silicon may be amorphous, microcrystalline, or polycrystalline. Alternatively, a metal oxide such as aluminum oxide, gallium oxide, zinc oxide, titanium dioxide, indium oxide, indium tin oxide, indium zinc oxide, or an In—Ga—Zn oxide may be used. The separation layer is preferably formed using a high-melting point metal material such as tungsten, titanium, or molybdenum, in which case the degree of freedom of the process for forming the layers to be separated can be increased.

The separation layer can be formed by, for example, a sputtering method, a plasma CVD method, a coating method (including a spin coating method, a droplet discharge method, a dispensing method, and the like), or a printing method. The thickness of the separation layer is, for example, greater than or equal to 10 nm and less than or equal to 200 nm, preferably greater than or equal to 20 nm and less than or equal to 100 nm.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer is formed to have a layered structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the separation layer is not necessarily provided in the case where separation at the interface between the formation substrate and the layer to be separated is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is increased by laser light irradiation or heat treatment. Then, an insulating film, a transistor, and the like are formed over the organic resin. After that, separation at the interface between the formation substrate and the organic resin can be performed by performing laser light irradiation with higher energy density than that of the above laser light irradiation or performing heat treatment at a higher temperature than that for the above heat treatment. Moreover, the interface between the formation substrate and the organic resin may be soaked in a liquid to perform separation.

Since the insulating film, the transistor, and the like are formed over the organic resin having low heat resistance in the above method, it is impossible to expose the substrate to high temperatures in the manufacturing process. Note that a transistor using an oxide semiconductor is not necessarily processed at high temperature and thus can be favorably formed over the organic resin.

The organic resin may be used for a substrate of the device. Alternatively, the organic resin may be removed and another substrate may be bonded to an exposed surface of the layer to be separated with the use of an adhesive. In addition, the organic resin may be bonded to another substrate (a supporting film) using an adhesive.

Alternatively, separation at the interface between a metal layer and the organic resin may be performed in the following manner: a metal layer is provided between the formation substrate and the organic resin and current is made to flow in the metal layer so that the metal layer is heated.

The insulating layer (the first layer) in contact with the separation layer preferably has a single-layer structure or a multilayer structure including any of a silicon nitride film, a silicon oxynitride film, a silicon oxide film, a silicon nitride oxide film, and the like. Note that a material for the insulating layer is not limited thereto, and an optimum material can be selected depending on a material used for the separation layer.

The insulating layer can be formed by a sputtering method, a plasma CVD method, a coating method, a printing method, or the like. For example, the insulating layer is formed at higher than or equal to 250° C. and lower than or equal to 400° C. by a plasma CVD method, whereby the insulating layer can be a dense film with high moisture resistance. The thickness of the insulating layer ranges preferably from 10 nm to 3000 nm, more preferably from 200 nm to 1500 nm.

Figure 13C:
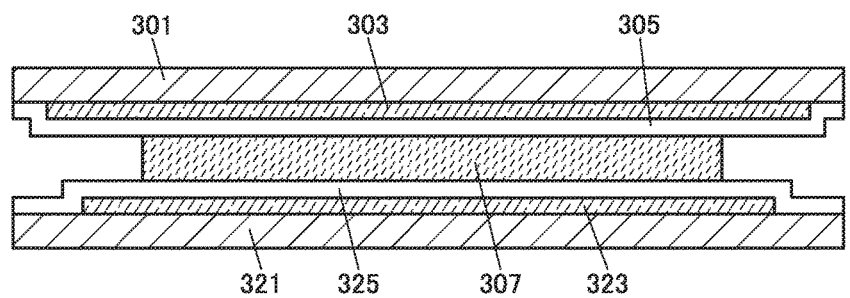

Next, the formation substrate 301 and the formation substrate 321 are attached to each other with a bonding layer 307 such that surfaces on which the layers to be separated are formed face each other, and the bonding layer 307 is cured (see FIG. 13C).

Note that the formation substrate 301 and the formation substrate 321 are preferably attached to each other in a reduced-pressure atmosphere.

Figure 13D:
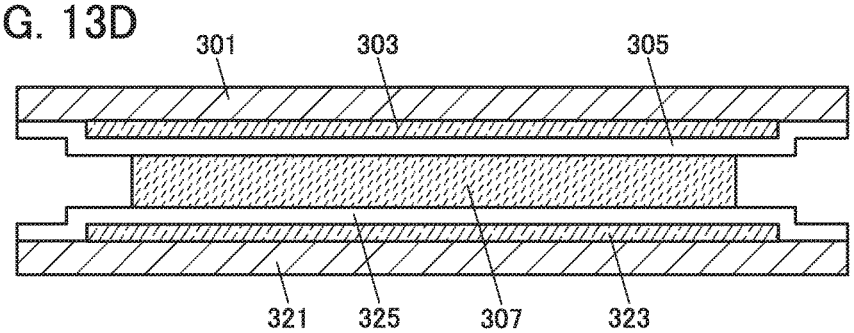

Note that although FIG. 13C illustrates the case where the separation layer 303 and the separation layer 323 are different in size, separation layers having the same size as illustrated in FIG. 13D may be used.

The bonding layer 307 is provided to overlap with the separation layer 303, the layer 305, the layer 325, and the separation layer 323. Then, the end portion of the bonding layer 307 is preferably positioned inward from at least the end portion of either the separation layer 303 or the separation layer 323 (the separation layer which is desirably separated first). Accordingly, strong adhesion between the formation substrate 301 and the formation substrate 321 can be suppressed; thus, a decrease in yield of a subsequent separating process can be suppressed.

As the bonding layer 307, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an EVA resin. A material with low moisture permeability, such as an epoxy resin, is particularly preferred. For the adhesive, a material having fluidity low enough to dispose the material only in a desired region is preferably used. For example, an adhesive sheet, a bonding sheet, or a sheet-like or film-like adhesive can be used, and an optical clear adhesive (OCA) film can be preferably used.

The adhesive may have adhesion before attachment or exhibit adhesion after attachment by heating or light irradiation.

Furthermore, the resin may include a drying agent. For example, it is possible to use a substance that adsorbs moisture by chemical adsorption, such as oxide of an alkaline earth metal (e.g., calcium oxide or barium oxide), or a substance that adsorbs moisture by physical adsorption, such as zeolite or silica gel. The drying agent is preferably included, in which case it can suppress deterioration of the functional element due to entry of moisture in the air and can improve the reliability of the device.

Figure 14A:
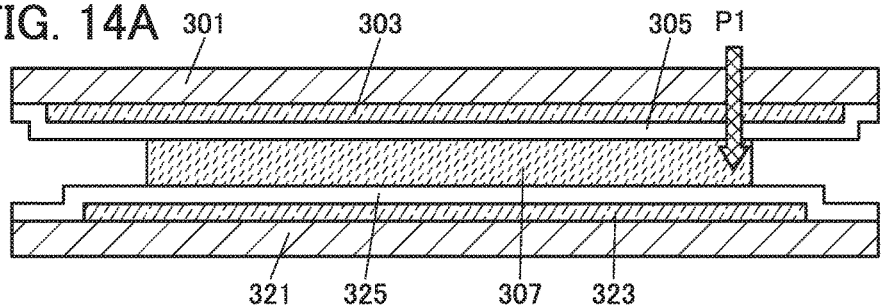
FIGS. 14A to 14D illustrate the method for manufacturing a display device of one embodiment.
Figure 14B:
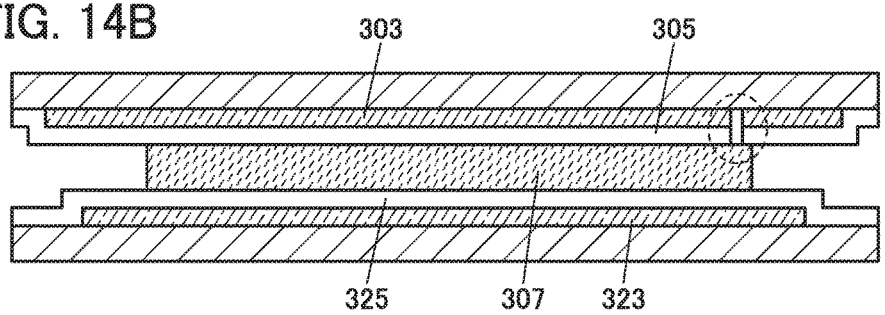

Next, a separation trigger is formed by laser irradiation (FIGS. 14A and 14B).

Either the formation substrate 301 or the formation substrate 321 can be separated first. In the case where the separation layers differ in size, a substrate over which a larger separation layer is formed may be separated first or a substrate over which a smaller separation layer is formed may be separated first. In the case where an element such as a semiconductor element or a light-emitting element is formed only over one of the substrates, the substrate on the side where the element is formed may be separated first or the other substrate may be separated first. Here, the formation substrate 301 is separated first.

A region where the bonding layer 307 in a cured state, the layer 305, and the separation layer 303 overlap with one another is irradiated with laser light (see the arrow P1 in FIG. 14A).

Part of the first layer is removed; thus, the separation trigger can be formed (see a region surrounded by a dashed line in FIG. 14B). At this time, not only the first layer but also the separation layer 303, the bonding layer 307, or another layer included in the layer 305 may be partly removed.

It is preferred that laser light irradiation be performed from the side of the substrate provided with the separation layer that is desirably separated. In the case where a region where the separation layer 303 and the separation layer 323 overlap with each other is irradiated with laser light, the formation substrate 301 and the separation layer 303 can be selectively separated from each other by cracking only the layer 305 of the layers 305 and 325 (see a region surrounded by the dotted line in FIG. 14B). Here, an example in which layers of the layer 305 are partly removed is shown.

Figure 14C:
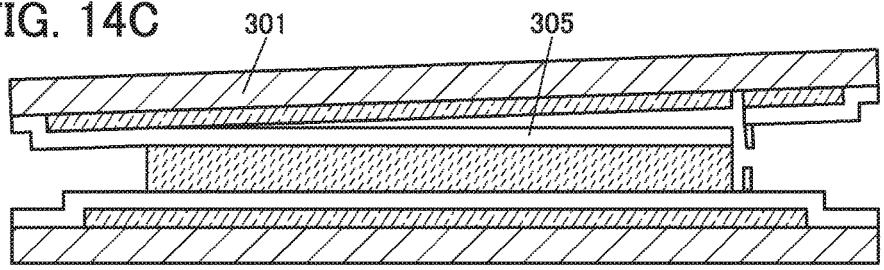
Figure 14D:
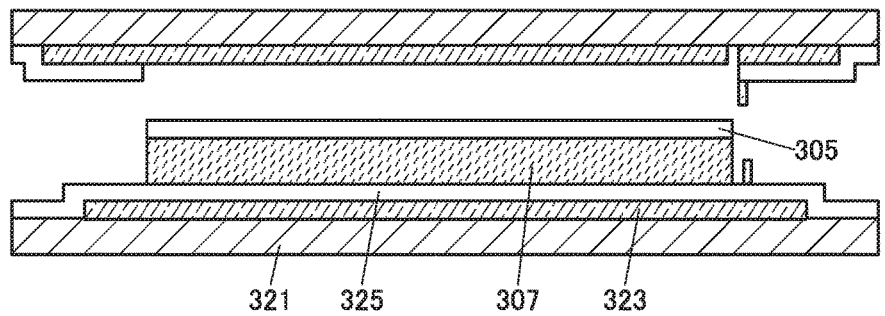

Then, the layer 305 and the formation substrate 301 are separated from each other from the formed separation trigger (FIGS. 14C and 14D). Consequently, the layer 305 can be transferred from the formation substrate 301 to the formation substrate 321.

For example, the layer 305 and the formation substrate 301 may be separated from each other from the separation trigger with mechanical force (e.g., a separation process with a human hand or a gripper, or a separation process by rotation of a roller).

The formation substrate 301 and the layer 305 may be separated from each other by making a liquid such as water permeate the interface between the separation layer 303 and the layer 305. A portion between the separation layer 303 and the layer 305 absorbs a liquid through a capillarity action, facilitating separation. Furthermore, an adverse effect on the functional element included in the layer 305 due to static electricity caused at separation (e.g., a phenomenon in which a semiconductor element is damaged by static electricity) can be suppressed.

Figure 15A:
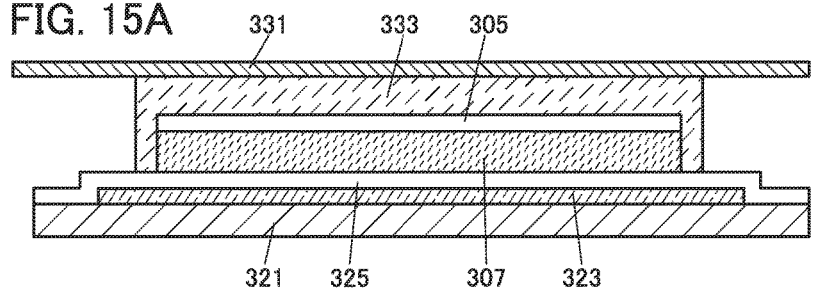
FIGS. 15A to 15D illustrate the method for manufacturing a display device of one embodiment.

Next, the exposed layer 305 is attached to a substrate 331 with a bonding layer 333, and the bonding layer 333 is cured (FIG. 15A).

Note that the layer 305 and the substrate 331 are preferably attached to each other in a reduced-pressure atmosphere.

Figure 15B:
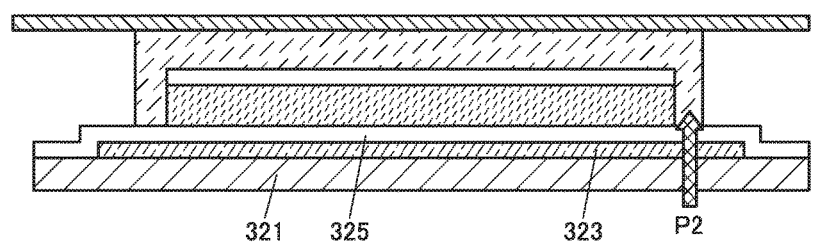
Figure 15C:
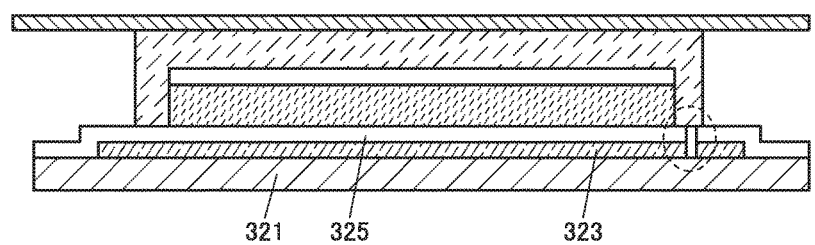

Subsequently, a separation trigger is formed by laser light irradiation (FIGS. 15B and 15C).

A region where the bonding layer 333 in a cured state, the layer 325, and the separation layer 323 overlap with each other is irradiated with laser light (see the arrow P2 in FIG. 15B). Part of the first layer is removed; thus, the separation trigger can be formed (see a region surrounded by a dashed line in FIG. 15C. Here, an example in which layers of the layer 325 are partly removed is shown). At this time, not only the first layer but also the separation layer 323, the bonding layer 333, or another layer included in the layer 325 may be partly removed.

Laser light is preferably delivered toward the formation substrate 321 provided with the separation layer 323.

Figure 15D:
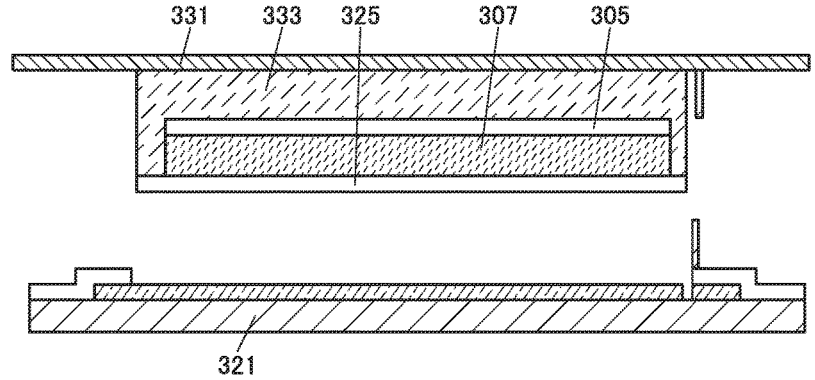

Then, the layer 325 and the formation substrate 321 are separated from each other from the separation trigger (see FIG. 15D). Accordingly, the layer 305 and the layer 325 can be transferred to the substrate 331.

After that, another substrate may be bonded to the layer 325.

Figure 16A:
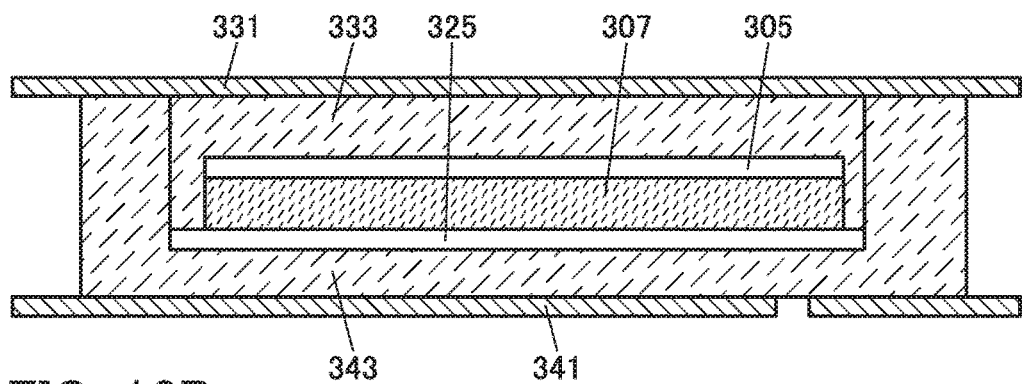
FIGS. 16A and 16B illustrate the method for manufacturing a display device of one embodiment.

The exposed layer 325 is attached to a substrate 341 with a bonding layer 343, and the bonding layer 343 is cured (FIG. 16A). FIG. 16A shows an example in which an opening has been already formed in the substrate 341.

In this manner, the separated layers can be sandwiched between the pair of flexible substrates.

Figure 16B:
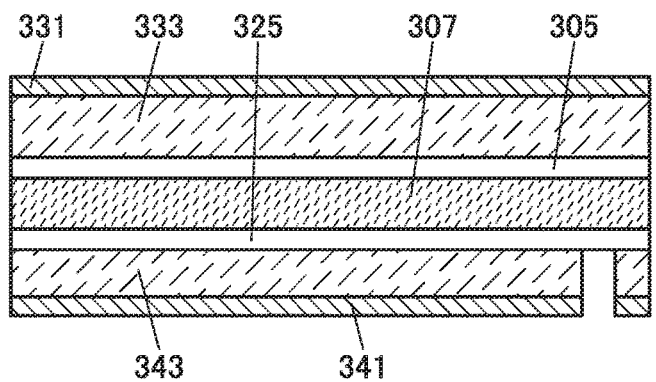

After that, unnecessary end portions of the substrate 331, the substrate 341, and the like may be cut and removed as shown in FIG. 16B. Part of the end portions of the layers 305 and 325 may be cut at the same time.

By the above method, a flexible device can be fabricated. The separated layers having the structure described in the above embodiment can be used to fabricate a flexible display device.

In the above method for manufacturing the display device of one embodiment of the present invention, a pair of formation substrates each provided with a separation layer and a layer to be separated are attached to each other, and then, a separation trigger is formed by laser light irradiation to make separation of the layer to be separated from the separation layer easier. As a result, the yield of the separation process can be improved.

In addition, separation is performed after the formation substrates each provided with the separated layer are attached to each other in advance, and then a substrate that is included in a device desired to be fabricated can be attached to the separated layer. As described above, formation substrates having low flexibility can be attached to each other when the layers to be separated are attached to each other; thus, alignment accuracy at the time of attachment can be improved compared with the case where flexible substrates are attached to each other.

As shown in FIG. 17A, the end portion of a separation region 351 of the layer 305 is preferably positioned inward from the end portion of the separation layer 303. This can improve the yield of the separation process. When there is a plurality of regions 351, the separation layer 303 may be provided for each region 351 as shown in FIG. 17B, or the plurality of regions 351 may be provided over one separation layer 303 as shown in FIG. 17C.

The above is the description of a manufacturing method of a flexible display device.

At least part of this embodiment can be implemented in combination with any of the other embodiments described in this specification as appropriate.

(Embodiment 4)

In this embodiment, examples of electronic devices that can include a display device of one embodiment of the present invention will be described.

Electronic devices and lighting devices can be manufactured using the display device of one embodiment of the present invention. Electronic devices and lighting devices with high display quality can be manufactured using the display device of one embodiment of the present invention. Electronic devices and lighting devices with favorable viewing angle characteristics can be manufactured using the display device of one embodiment of the present invention. Electronic devices and lighting devices with low power consumption can be manufactured using the display device of one embodiment of the present invention. In addition, highly reliable electronic devices and highly reliable lighting devices can be manufactured using the display device of one embodiment of the present invention.

Examples of electronic devices include a television set, desktop and laptop personal computers, monitors of a computer and the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, information, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of kinds of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

FIGS. 18A to 18E illustrate examples of electronic devices each including a display portion 7000 with a curved surface. Since the display surface of the display portion 7000 is curved, images can be displayed on the curved display surface. The display portion 7000 may have flexibility.

The display portion 7000 is formed using the display device or the like of one embodiment of the present invention. One embodiment of the present invention makes it possible to provide a highly reliable electronic device with low power consumption and a curved display portion.

Figure 18A:
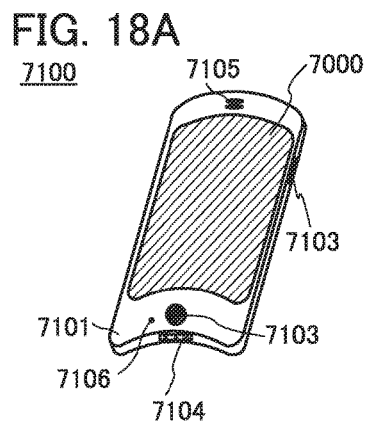
FIGS. 18A to 18F illustrate electronic devices of embodiments.
Figure 18B:
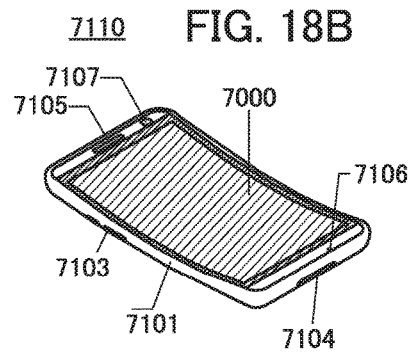

FIGS. 18A and 18B illustrate examples of mobile phones. A mobile phone 7100 illustrated in FIG. 18A and a mobile phone 7110 illustrated in FIG. 18B each include a housing 7101, the display portion 7000, operation buttons 7103, an external connection port 7104, a speaker 7105, a microphone 7106, and the like. The mobile phone 7110 illustrated in FIG. 18B also includes a camera 7107.

Each mobile phone includes a touch sensor in the display portion 7000. Operations such as making a call and inputting text can be performed by touch on the display portion 7000 with a finger, a stylus, or the like.

With the operation buttons 7103, the power can be turned on or off. In addition, types of images displayed on the display portion 7000 can be changed; for example, switching from a mail creation screen to a main menu screen can be performed.

When a detection device such as a gyroscope or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 18C:
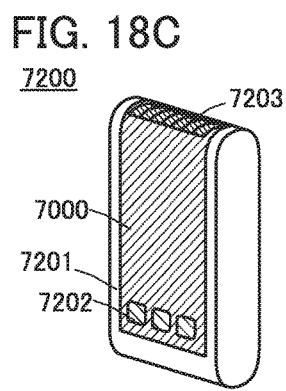
Figure 18D:
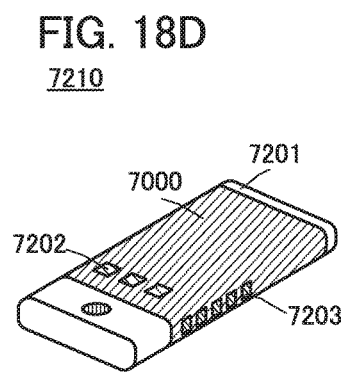

FIGS. 18C and 18D illustrate examples of portable information terminals. A portable information terminal 7200 illustrated in FIG. 18C and a portable information terminal 7210 illustrated in FIG. 18D each include a housing 7201 and the display portion 7000. Each of the portable information terminals may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals can each be used as a smartphone. Each of the portable information terminals illustrated in this embodiment is capable of executing, for example, a variety of applications such as mobile phone calls, e-mailing, reading and editing text, music reproduction, Internet communication, and a computer game.

The portable information terminals 7200 and 7210 can display text, image information, and the like on their plurality of surfaces. For example, as illustrated in FIGS. 18C and 18D, three operation buttons 7202 can be displayed on one surface, and information 7203 indicated by a rectangle can be displayed on another surface. FIG. 18C illustrates an example in which information is displayed on the top of the portable information terminal. FIG. 18D illustrates an example in which information is displayed on the side of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery level, and the reception sensitivity of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 18E:
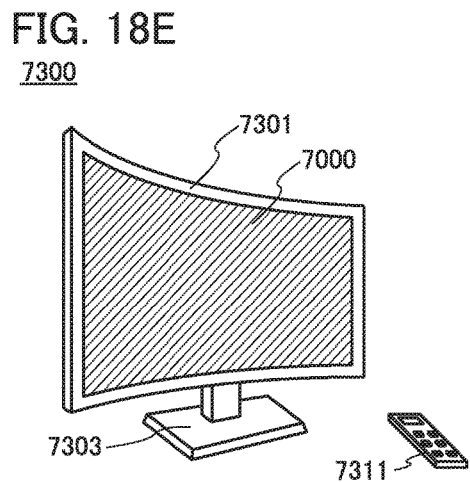

FIG. 18E illustrates an example of a television set. In a television set 7300, the display portion 7000 is incorporated into a housing 7301. Here, the housing 7301 is supported by a stand 7303.

The television set 7300 illustrated in FIG. 18E can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and a video displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 18F:
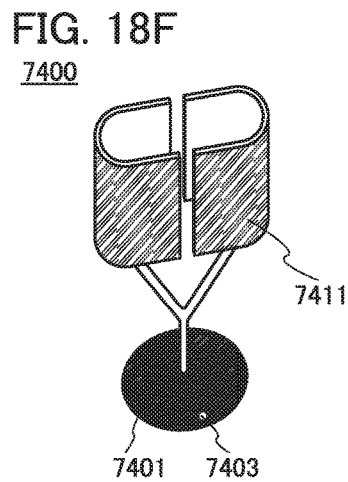

FIG. 18F illustrates an example of a lighting device having a curved light-emitting portion.

The light-emitting portion included in the lighting device illustrated in FIG. 18F can be manufactured using the display device or the like of one embodiment of the present invention. According to one embodiment of the present invention, a highly reliable lighting device with low power consumption and a curved light-emitting portion can be provided.

A light-emitting portion 7411 included in a lighting device 7400 illustrated in FIG. 18F has two convex-curved light-emitting portions symmetrically placed. Thus, light radiates from the lighting device 7400 in all directions.

The light-emitting portion 7411 included in the lighting device 7400 may have flexibility. The light-emitting portion 7411 may be fixed on a plastic member, a movable frame, or the like so that a light-emitting surface of the light-emitting portion 7411 can be bent freely depending on the intended use.

The lighting device 7400 includes a stage 7401 provided with an operation switch 7403 and the light-emitting portion 7411 supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 19A to 19I illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

Figure 19A:
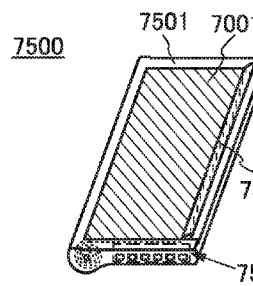
FIGS. 19A to 19I illustrate electronic devices of embodiments.
Figure 19B:
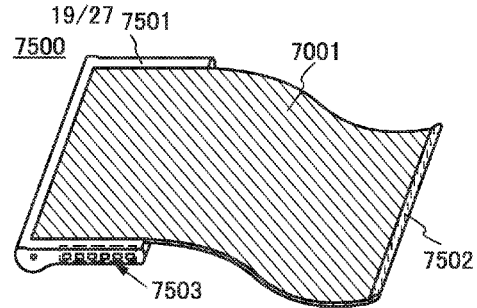

FIGS. 19A and 19B are perspective views illustrating an example of the portable information terminal. A portable information terminal 7500 includes a housing 7501, the display portion 7001, a display portion tab 7502, operation buttons 7503, and the like.

The portable information terminal 7500 includes the rolled flexible display portion 7001 in the housing 7501. The display portion 7001 can be pulled out with the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, changing of displayed videos, and the like can be performed. Although FIGS. 19A and 19B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 19B illustrates the portable information terminal 7500 in a state where the display portion 7001 is pulled out. A video can be displayed on the display portion 7001 in this state. In addition, the portable information terminal 7500 may perform different types of display in the state where part of the display portion 7001 is rolled as shown in FIG. 19A and in the state where the display portion 7001 is pulled out as shown in FIG. 19B. For example, in the state shown in FIG. 19A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figure 19C:
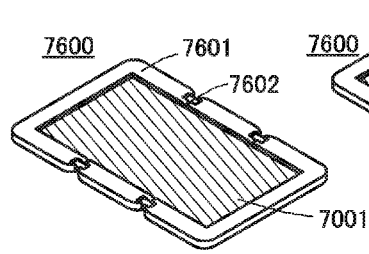
Figure 19D:
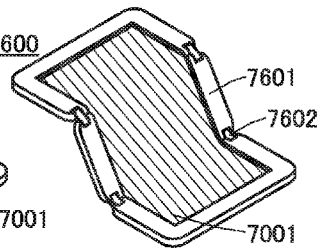
Figure 19E:
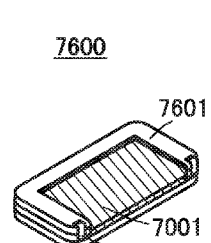

FIGS. 19C to 19E illustrate an example of a foldable portable information terminal. FIG. 19C illustrates a portable information terminal 7600 that is unfolded. FIG. 19D illustrates the portable information terminal 7600 that is being unfolded or folded. FIG. 19E illustrates the portable information terminal 7600 that is folded. The portable information terminal 7600 is highly portable when folded, and is highly browsable when unfolded because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an unfolded state to a folded state.

Figure 19F:
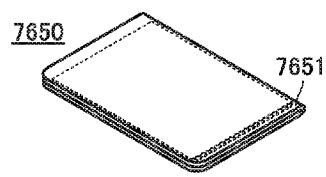
Figure 19G:
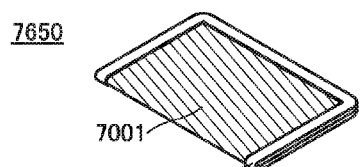

FIGS. 19F and 19G illustrate an example of a foldable portable information terminal. FIG. 19F illustrates a portable information terminal 7650 that is folded so that the display portion 7001 is on the inside. FIG. 19G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

Figure 19H:
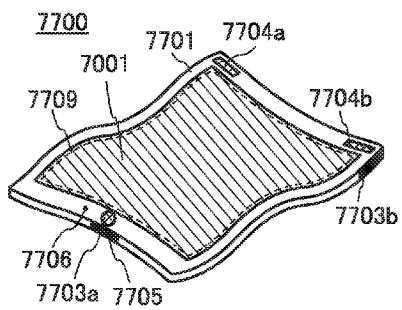

FIG. 19H illustrates an example of a flexible portable information terminal. A portable information terminal 7700 includes a housing 7701 and the display portion 7001. The portable information terminal 7700 may further include buttons 7703*a* and 7703*b* serving as input portions, speakers 7704*a* and 7704*b* serving as sound output portions, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 19I:
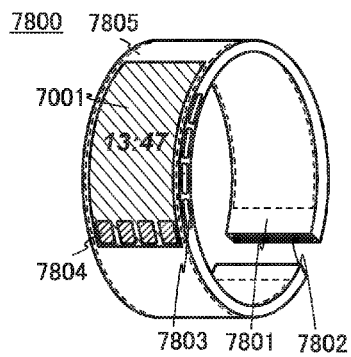

FIG. 19I illustrates an example of a wrist-watch-type portable information terminal. The portable information terminal 7800 includes a band 7801, the display portion 7001, an input/output terminal 7802, operation buttons 7803, and the like. The band 7801 has a function of a housing. A flexible battery 7805 can be included in the portable information terminal 7800. The battery 7805 may be provided to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of a silent mode, and setting and cancellation of a power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 20A:
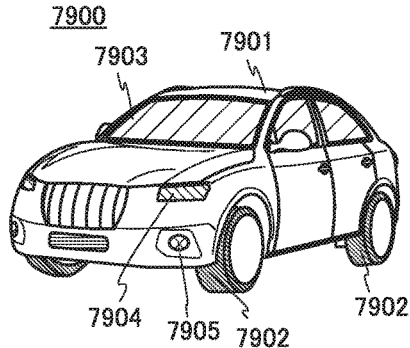
FIGS. 20A to 20F illustrate electronic devices of embodiments.
Figure 20B:
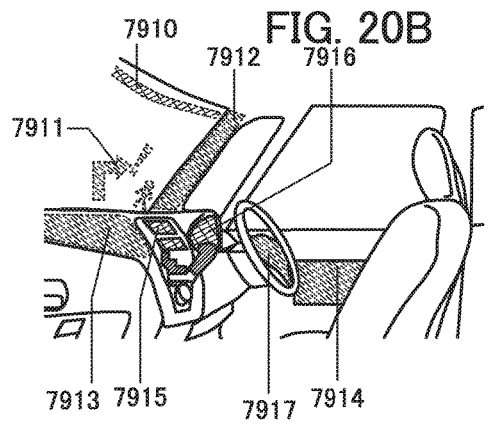

FIG. 20A is an external view of an automobile 7900. FIG. 20B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 20B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using an oxide semiconductor, is preferably used.

A display portion 7912 is provided on a pillar portion. A display portion 7913 is provided on a dashboard. For example, the display portion 7912 can compensate for the view hindered by the pillar portion by showing an image taken by an imaging portion provided on the car body.

Similarly, the display portion 7913 can compensate for the view hindered by the dashboard and a display portion 7914 can compensate for the view hindered by the door. That is, showing a video taken by an imaging portion provided on the outside of the automobile leads to elimination of blind areas and enhancement of safety. In addition, showing a video so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation information, a speedometer, a tachometer, a mileage, a fuel meter, a gearshift indicator, and air-condition setting. The content, layout, or the like of the display on the display portions can be customized freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 20C:
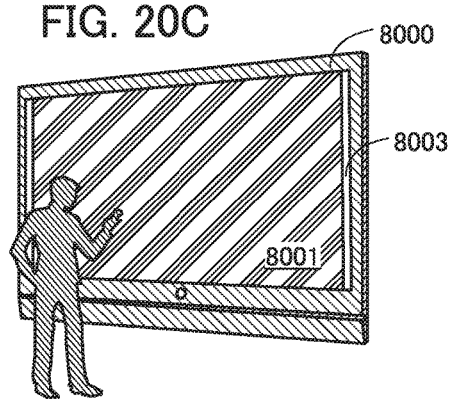
Figure 20D:
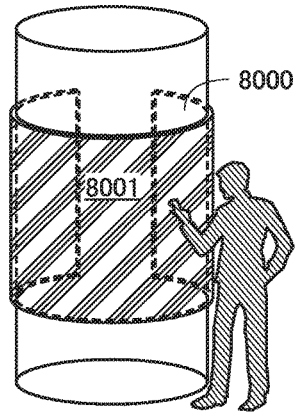

FIGS. 20C and 20D illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 20D illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the device is used to provide information such as route information or traffic information, usability can be enhanced by intuitive operation.

Figure 20E:
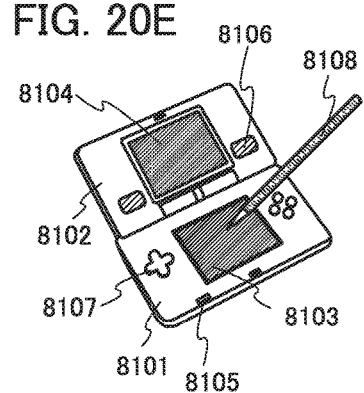

FIG. 20E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 20E includes two display portions 8103 and 8104. Note that the number of display portions of the electronic device of one embodiment of the present invention is not limited to two and can be one or three or more as long as at least one display portion includes the display device of one embodiment of the present invention.

Figure 20F:
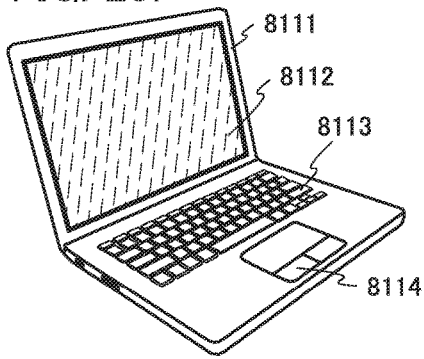

FIG. 20F illustrates a laptop personal computer which includes a housing 8111, a display portion 8112, a keyboard 8113, a pointing device 8114, and the like.

The display device of one embodiment of the present invention can be used for the display portion 8112.

Figure 21A:
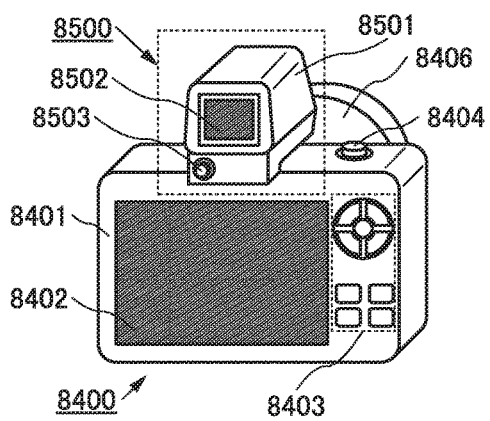
FIGS. 21A to 21E illustrate electronic devices of embodiments.

FIG. 21A is an external view of a camera 8400 to which a finder 8500 is attached.

The camera 8400 includes a housing 8401, a display portion 8402, an operation button 8403, a shutter button 8404, and the like. Furthermore, an attachable lens 8406 is attached to the camera 8400.

Although the lens 8406 of the camera 8400 here is detachable from the housing 8401 for replacement, the lens 8406 may be built into a housing.

When the shutter button 8404 is pressed, the camera 8400 can take images. In addition, the display portion 8402 has a function of a touch panel, and images can be taken when the display portion 8402 is touched.

The housing 8401 of the camera 8400 has a mount including an electrode, and the finder 8500, a stroboscope, and the like can be connected.

The finder 8500 includes a housing 8501, a display portion 8502, a button 8503, and the like.

The housing 8501 includes a mount for engagement with the mount of the camera 8400 so that the finder 8500 can be connected to the camera 8400. The mount includes an electrode, and a moving image or the like received from the camera 8400 through the electrode can be displayed on the display portion 8502.

The button 8503 serves as a power button. The display portion 8502 can be turned on and off using the button 8503.

A display device of one embodiment of the present invention can be used for the display portion 8402 of the camera 8400 and the display portion 8502 of the finder 8500.

Although the camera 8400 and the finder 8500 are separate and detachable electronic devices in FIG. 21A, a finder including the display device of one embodiment of the present invention may be built into the housing 8401 of the camera 8400.

Figure 21B:
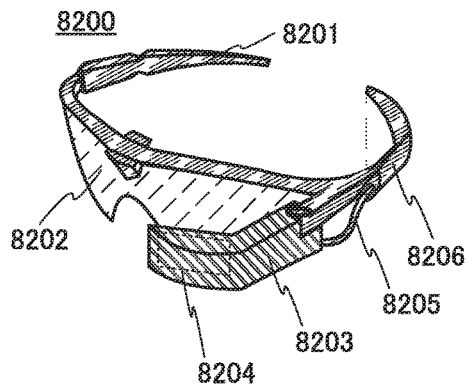

FIG. 21B is an external view of a head-mounted display 8200.

The head-mounted display 8200 includes a mounting portion 8201, a lens 8202, a main body 8203, a display portion 8204, a cable 8205, and the like. In addition, a battery 8206 is built into the mounting portion 8201.

Power is supplied from the battery 8206 to the main body 8203 through the cable 8205. The main body 8203 includes a wireless receiver or the like to receive video data such as image data and display it on the display portion 8204. The movement of the user's eyeball or eyelid is captured by a camera in the main body 8203 and then the coordinates of the eyepoint are calculated using the captured data to utilize the user's eye as an input portion.

A plurality of electrodes may be provided in a portion of the mounting portion 8201 a user touches. The main body 8203 may have a function of sensing a current flowing through the electrodes with the movement of the user's eyeball to determine the location of the eyepoint. The main body 8203 may have a function of sensing a current flowing through the electrodes to monitor the user's pulse. The mounting portion 8201 may include sensors such as a temperature sensor, a pressure sensor, or an acceleration sensor so that the user's biological information can be displayed on the display portion 8204. The main body 8203 may sense the movement of the user's head or the like to move an image displayed on the display portion 8204 in synchronization with the movement of the user's head, or the like.

The display device of one embodiment of the present invention can be used for the display portion 8204.

Figure 21C:
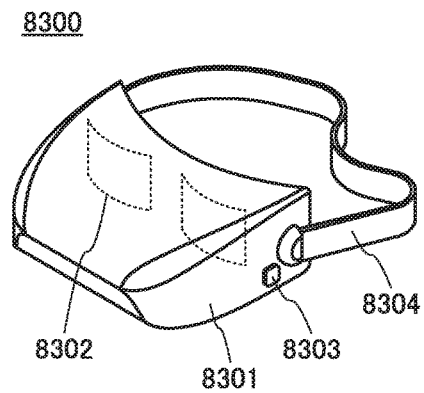
Figure 21D:
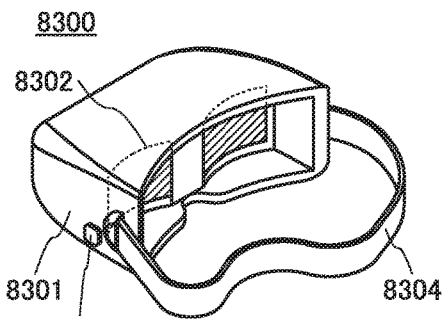

FIGS. 21C and 21D are external views of a head-mounted display 8300.

The head-mounted display 8300 includes a housing 8301, two display portions 8302, an operation button 8303, and a fixing band 8304.

The head-mounted display 8300 has the functions of the above-described head-mounted display 8200 and includes two display portions.

Since the head-mounted display 8300 includes the two display portions 8302, the user's eyes can see their respective display portions. Thus, a high-definition image can be displayed even when a three-dimensional display using parallax, or the like, is performed. In addition, the display portion 8302 is curved around an arc with the user's eye as an approximate center. Owing to this, the distance between the user's eye and the display surface of the display portion is uniform; thus, the user can see a more natural image. Even when the luminance or chromaticity of light emitted from the display portion varies depending on the user' viewing angle, the influence of the variation can be substantially ignorable and thus a more realistic image can be displayed because the user's eye is positioned in the normal direction of the display surface of the display portion.

The operation button 8303 serves as a power button or the like. A button other than the operation button 8303 may be included.

Figure 21E:
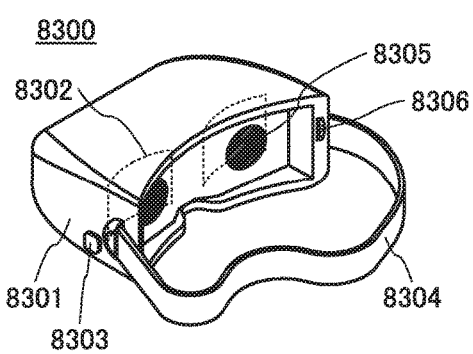

As illustrated in FIG. 21E, lenses 8305 may be provided between the display portion 8302 and the user's eyes. The user can see magnified images on the display portion 8302 through the lenses 8305, leading to higher sense of presence. In that case, as illustrated in FIG. 21E, a dial 8306 for changing the position of the lenses and adjusting visibility may be included.

The display device of one embodiment of the present invention can be used for the display portion 8302. Since the display device of one embodiment of the present invention has extremely high definition, even when an image is magnified using the lenses 8305 as illustrated in FIG. 21E, the pixels are not perceived by the user, and thus a more realistic image can be displayed.

Figure 22A:
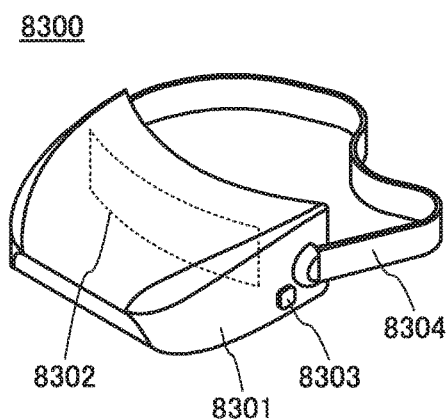
FIGS. 22A to 22C illustrate electronic devices of embodiments.
Figure 22B:
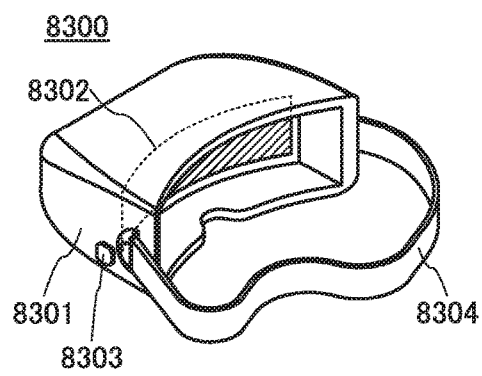
Figure 22C:
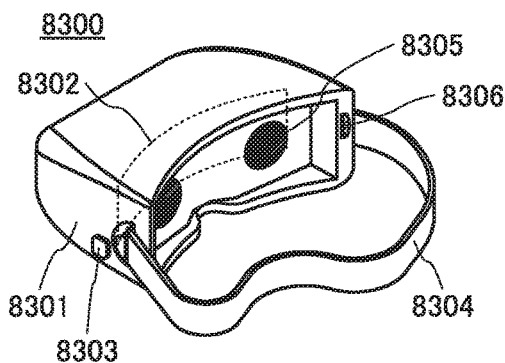

FIGS. 22A to 22C are examples in which the head-mounted display includes one display portion 8302. Such a structure can reduce the number of components.

The display portion 8302 can display an image for the right eye and an image for the left eye side by side on a right region and a left region, respectively. Thus, a three-dimensional moving image using binocular disparity can be displayed.

One image which can be seen by both eyes may be displayed on all over the display portion 8302. A panorama moving image can thus be displayed from end to end of the field of view; thus, the sense of reality is increased.

As shown in FIG. 22C, the lenses 8305 may be provided. Two images may be displayed side by side on the display portion 8302. Alternatively, one image may be displayed on the display portion 8302 and seen by both eyes through the lenses 8305.

At least part of this embodiment can be implemented in combination with any of the other embodiments described in this specification as appropriate.

[Example]

Figure 26A:
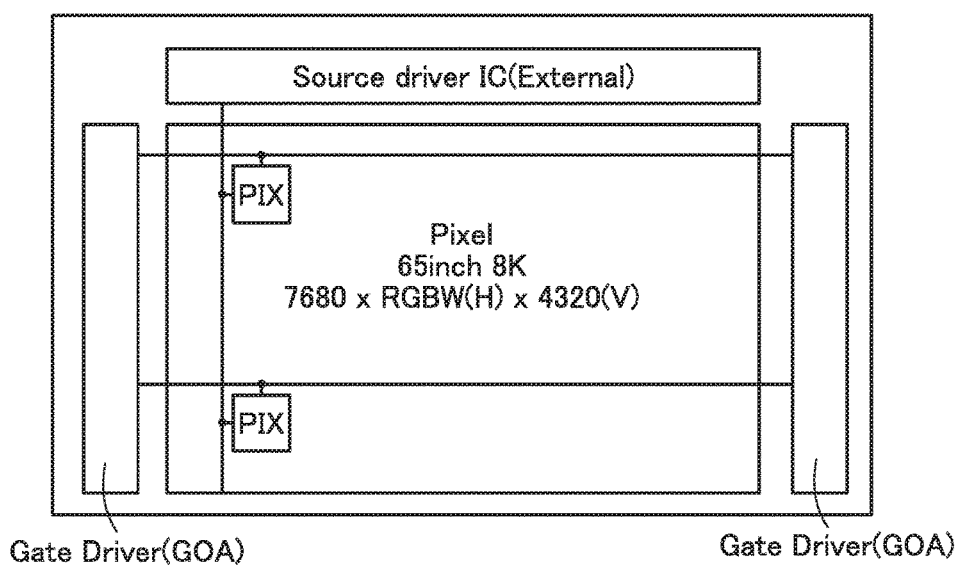
FIGS. 26A and 26B are a block diagram and a circuit diagram of Example.
Figure 26B:
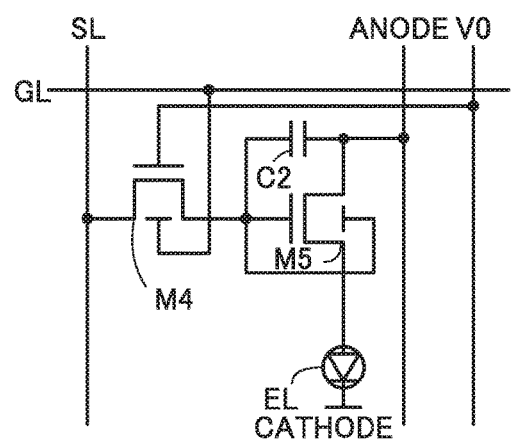

The time required to charge and discharge wirings of a display device of one embodiment of the present invention, and the like, were calculated. FIG. 26A is a block diagram of the display device used for the calculation. FIG. 26B is a circuit diagram of a fabricated pixel corresponding to the top view.

The block diagram of the display device in FIG. 26A illustrates a so-called 8K panel, which has a dimension of 65 inches and includes 7680×4320 pixels (PIX) composed of subpixels for red, green, blue, and white (RGBW) arranged in stripes. Scan line driver circuits (Gate Driver) provided on opposite sides are fabricated by gate on array (GOA) and output scan signals to the pixels (PIX). A signal line driver circuit (Source Driver) is externally provided.

FIG. 26B is a circuit diagram of the pixel (PIX) illustrated in FIG. 26A. The configuration of the circuit diagram in FIG. 26B corresponds to the configuration in FIG. 7A in which the position of the capacitor C2 is changed.

In the configuration in FIG. 26B, a first gate electrode and a second gate electrode are not connected to each other in the transistor M4 as in FIG. 7A. With this configuration, the gate capacitance between a scan line GL and the transistor M4 is formed only between the scan line GL and the first gate electrode in contrast to a configuration where gate electrodes are connected to each other.

Figure 27:
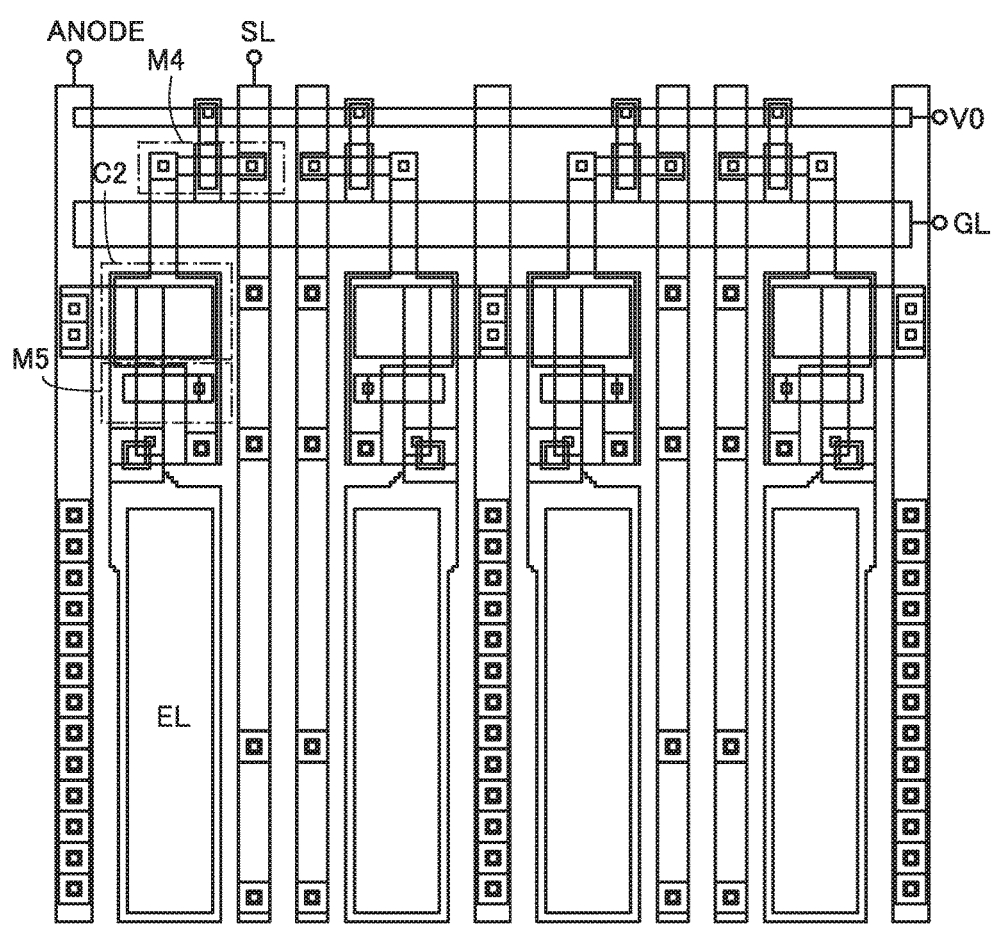
FIG. 27 is a top view of Example.

FIG. 27 is a top view of the pixel (PIX) corresponding to FIG. 26B. The pixel illustrated in FIG. 27 includes four subpixels for RGBW. Note that components corresponding to those in the circuit diagram are denoted by the same reference symbols. The time required to charge and discharge wirings such as a scan line and a signal line was estimated using the configurations illustrated in FIGS. 26A and 26B and FIG. 27. Various calculations to estimate the time required for charge and discharge were conducted using the software SmartSpice produced by SILVACO, Inc. Note that the pixel size is 188 μm×188 μm, the transistor M4 has a channel length L of 4 μm and a channel width W of 4 μm, and the transistor M5 has a channel length L of 6 μm and a channel width W of 6 μm.

Table 1 shows the calculation results. In Table 1, "Gate fall time" refers to time required for a scan signal to fall, "Source line charge time (>95%)" refers to time required to charge the signal line to 95%, "Total" refers to the total of Gate fall time and Source line charge time, and "One horizontal period" refers to one horizontal scanning period.

TABLE 1

| Gate fall time | Source line charge time(>95%) | Total | One horizontal period |
| --- | --- | --- | --- |
| 0.90 μs | 0.97 μs | 1.87 μs | 1.92 μs |

As shown in Table 1, time required to charge and discharge the scan line and the signal line falls within one horizontal scanning period. This implies that the display device of one embodiment of the present invention, in which the gate capacitance of the transistor connected to the scan line is small, is suitable for an 8K panel.

EXPLANATION OF REFERENCE

GL: scan line, SL: signal line, V0: wiring, ANODE: current supply line, M1: transistor, M2: transistor, M3: transistor, C1: capacitor, EL: light-emitting element, CATHODE: common wiring, 100: transistor, 102: substrate, 104: insulating layer, 106: conductive layer, 108: oxide semiconductor layer, 110: insulating layer, 112: oxide semiconductor layer, 116: insulating layer, 108i: channel region, 108s: source region, 108d: drain region, 141a: opening, 141b: opening, 120a: conductive layer, 120b: conductive layer, 151: conductive layer, 152: conductive layer, 153: insulating layer, 161: oxide semiconductor layer, 162: oxide semiconductor layer, 163: oxide semiconductor layer, 164: insulating layer, 171: oxide semiconductor layer, 172: oxide semiconductor layer, 173: oxide semiconductor layer, 174: insulating layer, 181: conductive layer, 182: conductive layer, 183: conductive layer, 184: conductive layer, 185: conductive layer, 186: insulating layer, 187: insulating layer, 190: opening, 191: conductive layer, 192: conductive layer, 193: insulating layer, 198: light-emitting layer, 199: partition layer, 10: display device, 11: pixel portion, 12: scan line driver circuit, 13: signal line driver circuit, 15: terminal portion, 16a: wiring, 16b: wiring, 22: region, 24: region, M4: transistor, M5: transistor, M6: transistor, M7: transistor, M8: transistor, M9: transistor, M10: transistor, M11: transistor, C2: capacitor, C3: capacitor, C4: capacitor, C5: capacitor, GL1: scan line, GL2: scan line, GL3: scan line, GL4: scan line, V1: wiring, V2: wiring, 201: substrate, 202: substrate, 211: insulating layer, 212: insulating layer, 213: insulating layer, 214: insulating layer, 215: spacer, 216: insulating layer, 217: insulating layer, 218: insulating layer, 220: bonding layer, 221: insulating layer, 222: EL layer, 223: electrode, 224: optical adjustment layer, 225: pixel electrode, 230a: structure, 230b: structure, 231: light-blocking layer, 232: coloring layer, 242: FOP, 243: connection layer, 250: space, 251: transistor, 252: transistor, 253: capacitor, 254: light-emitting element, 255: transistor, 260: sealing material, 261: bonding layer, 262: bonding layer, 271: semiconductor layer, 272: conductive layer, 273: conductive layer, 274: conductive layer, 275: conductive layer, 276: insulating layer, 291: conductive layer, 292: conductive layer, 293: conductive layer, 294: insulating layer, 295: bonding layer, 296: substrate, 297: FOP, 298: connection layer, 299: terminal portion, 301: formation substrate, 303: separation layer, 305: layer to be separated, 307: bonding layer, 321: formation substrate, 323: separation layer, 325: layer to be separated, 331: substrate, 333: bonding layer, 341: substrate, 343: bonding layer, 351: region, 7000: display portion, 7001: display portion, 7100: mobile phone, 7101: housing, 7103: operation button, 7104: external connection port, 7105: speaker, 7106: microphone, 7107: camera, 7110: mobile phone, 7200: portable information terminal, 7201: housing, 7202: operation button, 7203: information, 7210: portable information terminal, 7300: television set, 7301: housing, 7303: stand, 7311: remote controller, 7400: lighting device, 7401: stage, 7403: operation switch, 7411: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery, 7900: automobile, 7901: car body, 7902: wheel, 7903: windshield, 7904: light, 7905: fog lamp, 7910: display portion, 7911: display portion, 7912: display portion, 7913: display portion, 7914: display portion, 7915: display portion, 7916: display portion, 7917: display portion, 8000: housing, 8001: display portion, 8003: speaker, 8101: housing, 8102: housing, 8103: display portion, 8104: display portion, 8105: microphone, 8106: speaker, 8107: operation key, 8108: stylus, 8111: housing, 8112: display portion, 8113: keyboard, 8114: pointing device, 8200: head-mounted display, 8201: mounting portion, 8202: lens, 8203: main body, 8204: display portion, 8205: cable, 8206: battery, 8300: head-mounted display, 8301: housing, 8302: display portion, 8303: operation button, 8304: fixing band, 8305: lens, 8306: dial, 8400: camera, 8401: housing, 8402: display portion, 8403: operation button, 8404: shutter button, 8406: lens, 8500: finder, 8501: housing, 8502: display portion, 8503: button.

This application is based on Japanese Patent Application serial no. 2015-256583 filed with Japan Patent Office on Dec. 28, 2015 and Japanese Patent Application serial no. 2016-218998 filed with Japan Patent Office on Nov. 9, 2016, the entire contents of which are hereby incorporated by reference.

The invention claimed is:

1. A display device comprising:
   a first transistor;
   a second transistor;
   a first wiring; and
   a second wiring,
   wherein each of the first transistor and the second transistor includes a first gate electrode, an oxide semiconductor layer over the first gate electrode and a second gate electrode over the oxide semiconductor layer,
   wherein the first wiring is configured to transmit a signal for controlling conduction states of the first transistor,
   wherein the second wiring is configured to transmit a constant voltage,
   wherein the first gate electrode of the first transistor is electrically connected to the first wiring,
   wherein the second gate electrode of the first transistor is electrically connected to the second wiring,
   wherein the first gate electrode of the second transistor and the second gate electrode of the second transistor are electrically connected to each other,
   wherein one of a source and a drain of the first transistor is electrically connected to the first gate electrode of the second transistor,
   wherein the first gate electrode of the first transistor and the first gate electrode of the second transistor include a metal material, and
   wherein the second gate electrode of the first transistor and the second gate electrode of the second transistor include a metal oxide material.

2. The display device according to claim 1,
   wherein the oxide semiconductor layer includes oxygen, In, Zn, and M (M is Al, Ga, Y, or Sn).

3. The display device according to claim 1,
   wherein the oxide semiconductor layer includes a crystal part having c-axis alignment.

4. The display device according to claim 1,
   wherein the metal oxide material includes oxygen, In, Zn, and M (M is Al, Ga, Y, or Sn), and
   wherein the metal oxide material has a higher carrier density than a material of the oxide semiconductor layer.

5. A display module comprising:
   the display device according to claim 1; and
   a touch sensor.

6. An electronic device comprising:
   the display module according to claim 5; and
   an operation key or a battery.

7. A display device comprising:
   a first transistor;
   a second transistor;
   a third transistor;
   a light-emitting element;
   a first wiring;
   a second wiring;
   a third wiring; and
   a fourth wiring,
   wherein each of the first transistor, the second transistor and the third transistor includes a first gate electrode, an oxide semiconductor layer and a second gate electrode,
   wherein the first gate electrode of the first transistor is electrically connected to the first wiring,
   wherein the first gate electrode of the third transistor is electrically connected to the first wiring, wherein the second gate electrode of the first transistor is electrically connected to the second wiring,
wherein the second gate electrode of the third transistor is electrically connected to the second wiring,
wherein the first gate electrode of the second transistor and the second gate electrode of the second transistor are electrically connected to each other,
wherein one of a source and a drain of the first transistor is electrically connected to the first gate electrode of the second transistor,
wherein the other of the source and the drain of the first transistor is electrically connected to the third wiring,
wherein one of a source and a drain of the second transistor is electrically connected to the light-emitting element,
wherein the other of the source and the drain of the second transistor is electrically connected to the fourth wiring,
wherein one of a source and a drain of the third transistor is electrically connected to the one of the source and the drain of the second transistor,
wherein the other of the source and the drain of the third transistor is electrically connected to the second wiring,
wherein the first gate electrode of the first transistor, the first gate electrode of the second transistor, and the first gate electrode of the third transistor include a metal material, and
wherein the second gate electrode of the first transistor, the second gate electrode of the second transistor, and the second gate electrode of the third transistor include a metal oxide material.

8. The display device according to claim 7,
wherein the oxide semiconductor layer includes oxygen, In, Zn, and M (M is Al, Ga, Y, or Sn).

9. The display device according to claim 7,
wherein the oxide semiconductor layer includes a crystal part having c-axis alignment.

10. The display device according to claim 7,
wherein the metal oxide material includes oxygen, In, Zn, and M (M is Al, Ga, Y, or Sn), and
wherein the metal oxide material has a higher carrier density than a material of the oxide semiconductor layer.

11. A display module comprising:
the display device according to claim 7; and
a touch sensor.

12. An electronic device comprising:
the display module according to claim 11; and
an operation key or a battery.

13. A display device comprising:
a pixel comprising:
 a first transistor;
 a second transistor;
 a third transistor; and
 a light-emitting element;
a scan line;
a wiring;
a signal line; and
a current supply line,
wherein each of the first transistor, the second transistor and the third transistor includes a first gate electrode, an oxide semiconductor layer over the first gate electrode and a second gate electrode over the oxide semiconductor layer,
wherein the second wiring is configured to transmit a constant voltage,
wherein the first gate electrode of the first transistor is electrically connected to the scan line,
wherein the first gate electrode of the third transistor is electrically connected to the scan line,
wherein the second gate electrode of the first transistor is electrically connected to the wiring,
wherein the second gate electrode of the third transistor is electrically connected to the second wiring,
wherein the first gate electrode of the second transistor and the second gate electrode of the second transistor are electrically connected to each other,
wherein one of a source and a drain of the first transistor is electrically connected to the first gate electrode of the second transistor,
wherein the other of the source and the drain of the first transistor is electrically connected to the signal line,
wherein one of a source and a drain of the second transistor is electrically connected to the light-emitting element,
wherein the other of the source and the drain of the second transistor is electrically connected to the current supply line,
wherein one of a source and a drain of the third transistor is electrically connected to the one of the source and the drain of the second transistor,
wherein the first gate electrode of the first transistor, the first gate electrode of the second transistor, and the first gate electrode of the third transistor include a metal material, and
wherein the second gate electrode of the first transistor, the second gate electrode of the second transistor, and the second gate electrode of the third transistor include a metal oxide material.

14. The display device according to claim 13,
wherein the oxide semiconductor layer includes oxygen, In, Zn, and M (M is Al, Ga, Y, or Sn).

15. The display device according to claim 13,
wherein the oxide semiconductor layer includes a crystal part having c-axis alignment.

16. The display device according to claim 13,
wherein the metal oxide material includes oxygen, In, Zn, and M (M is Al, Ga, Y, or Sn), and
wherein the metal oxide material has a higher carrier density than a material of the oxide semiconductor layer.

17. A display module comprising:
the display device according to claim 13; and
a touch sensor.

18. An electronic device comprising:
the display module according to claim 17; and
an operation key or a battery.

19. A display device comprising:
a pixel comprising:
 a first transistor;
 a second transistor;
 a capacitor; and
 a light-emitting element;
a first wiring; and
a second wiring,
wherein each of the first transistor and the second transistor includes a first gate electrode, an oxide semiconductor layer over the first gate electrode and a second gate electrode over the oxide semiconductor layer,
wherein the first wiring is configured to transmit a signal for controlling conduction states of the first transistor,
wherein the second wiring is configured to transmit a constant voltage,
wherein the first gate electrode of the first transistor is electrically connected to the first wiring, wherein the second gate electrode of the first transistor is electrically connected to the second wiring,
wherein the first gate electrode of the second transistor and the second gate electrode of the second transistor are electrically connected to each other,
wherein one of a source and a drain of the first transistor is electrically connected to the first gate electrode of the second transistor,
wherein one of a source and a drain of the second transistor is electrically connected to the light-emitting element,
wherein a first electrode of the capacitor is electrically connected to the first gate electrode of the second transistor,
wherein a second electrode of the capacitor is electrically connected to the one of the source and the drain of the second transistor,
wherein the first gate electrode of the first transistor and the first gate electrode of the second transistor include a metal material, and
wherein the second gate electrode of the first transistor and the second gate electrode of the second transistor include a metal oxide material.

20. The display device according to claim 19,
wherein the oxide semiconductor layer includes oxygen, In, Zn, and M (M is Al, Ga, Y, or Sn).

21. The display device according to claim 19,
wherein the oxide semiconductor layer includes a crystal part having c-axis alignment.

22. The display device according to claim 19,
wherein the metal oxide material includes oxygen, In, Zn, and M (M is Al, Ga, Y, or Sn), and
wherein the metal oxide material has a higher carrier density than a material of the oxide semiconductor layer.

23. A display module comprising:
the display device according to claim 19; and
a touch sensor.

24. An electronic device comprising:
the display module according to claim 23; and
an operation key or a battery.

25. The display device according to claim 19,
wherein an insulating layer is over the second gate electrode of the first transistor and the second gate electrode of the second transistor,
wherein a conductive layer is over the insulating layer, and
wherein the conductive layer in an opening formed in the insulating layer is in contact with the oxide semiconductor layer of the first transistor.

* * * * *